(12) United States Patent
Nishio et al.

(10) Patent No.: US 6,462,580 B2
(45) Date of Patent: Oct. 8, 2002

(54) GATE CIRCUIT AND SEMICONDUCTOR CIRCUIT TO PROCESS LOW AMPLITUDE SIGNALS, MEMORY, PROCESSOR AND INFORMATION PROCESSING SYSTEM MANUFACTURED BY USE OF THEM

(75) Inventors: Yoji Nishio, Hitachi; Kosaku Hirose, Higashimurayama; Hideo Hara, Akigawa; Katsunori Koike; Kayoko Nemoto, both of Hitachi; Tatsumi Yamauchi, Hitachioota; Fumio Murabayashi, Urizura-machi; Hiromichi Yamada, Hadano, all of (JP)

(73) Assignees: Hitachi, Ltd., Tokyo; Hitachi Engineering Co., Ltd., Hitachi, both of (JP)

( * ) Notice: Subject to any disclaimer, the term of this patent is extended or adjusted under 35 U.S.C. 154(b) by 0 days.

(21) Appl. No.: 09/749,474

(22) Filed: Dec. 28, 2000

(65) Prior Publication Data

US 2001/0000653 A1 May 3, 2001

Related U.S. Application Data

(60) Continuation of application No. 08/925,428, filed on Sep. 8, 1997, now Pat. No. 6,172,532, which is a division of application No. 08/423,378, filed on Apr. 18, 1995, now Pat. No. 5,677,641.

(30) Foreign Application Priority Data

Apr. 20, 1994 (JP) .............................. 6-81324
Mar. 13, 1995 (JP) .............................. 7-52241

(51) Int. Cl.$^7$ .......................................... H03K 19/096

(52) U.S. Cl. ..................... 326/83; 326/106; 395/189.09

(58) Field of Search ............................ 326/83, 86, 111, 326/121, 106, 108, 81; 365/190, 207, 189.09

(56) References Cited

U.S. PATENT DOCUMENTS

| 4,176,289 A | * 11/1979 | Leach et al. ................... 326/83 |
| 4,406,957 A | 9/1983 | Atherton ....................... 326/86 |
| 5,151,616 A | 9/1992 | Komuro ....................... 326/121 |

(List continued on next page.)

FOREIGN PATENT DOCUMENTS

JP          61-293018          12/1986

(List continued on next page.)

OTHER PUBLICATIONS

Draper et al., "A 93MHz, X86 Microprocessor with On-Chip L2 Cache Controller", Donald *IEEE International Solid–State Circuits Conference*, pp. 172–173 (Feb. 16, 1995).

Primary Examiner—Don Phu Le
(74) Attorney, Agent, or Firm—Antonelli, Terry, Stout & Kraus, LLP

(57) ABSTRACT

The object of the present invention to provide a semiconductor integrated circuit device wherein the input signal is made to have a low amplitude to shorten transition time of the input signal, said integrated circuit device operating at a low power consumption, without flowing of breakthrough current, despite entry of the input signal featuring low-amplitude operations, and said integrated circuit device comprising a gate circuit, memory and processor. When input signal is supplied through the NMOS pass transistor, said input signal is input to the gate of the first NMOS transistor, and at the same time, is input into the gate of the first PMOS transistor which performs complementary operation with said first NMOS transistor through the second NMOS transistor; said first PMOS gate is connected to the power supply potential through the second PMOS transistor, and the gate of the said second NMOS transistor is connected to the power supply potential; wherein the gate of the said second PMOS transistor gate is controlled by the signal which is connected with both the drain of the said first NMOS transistor and the drain of the said first PMOS transistor.

24 Claims, 21 Drawing Sheets

U.S. PATENT DOCUMENTS

| | | | | |
|---|---|---|---|---|
| 5,153,467 A | * | 10/1992 | Mao | 326/83 |
| 5,229,659 A | | 7/1993 | Sandhu | 326/83 |
| 5,287,312 A | | 2/1994 | Okamura et al. | 365/230.06 |
| 5,359,240 A | * | 10/1994 | Sandhu | 326/83 |
| 5,383,158 A | | 1/1995 | Ikegami | 365/230.06 |
| 5,406,140 A | | 4/1995 | Wert et al. | 326/86 |
| 5,410,508 A | | 4/1995 | McLaury | 365/230.06 |
| 5,677,641 A | | 10/1997 | Nishio et al. | 326/121 |

FOREIGN PATENT DOCUMENTS

| | | |
|---|---|---|
| JP | 62-32722 | 2/1987 |
| JP | 62-186613 | 8/1987 |
| JP | 63-5172 | 1/1988 |

* cited by examiner

GATE CIRCUIT AND SEMICONDUCTOR CIRCUIT TO PROCESS LOW AMPLITUDE SIGNALS, MEMORY, PROCESSOR AND INFORMATION PROCESSING SYSTEM MANUFACTURED BY USE OF THEM

This is as Continuation application of Ser. No. 08/925,428, filed Sep. 8, 1997 now U.S. Pat. No. 6,172,532, which is a Divisional application of U.S. application Ser. No. 08/423,378, filed Apr. 18, 1995, and now U.S. Pat. No. 5,677,641.

BACKGROUND OF THE INVENTION

1. Field of Invention

The present invention relates to a gate circuit which is operated at high speed with low consumption power by low amplitude operation signals of the semiconductor integrated circuit device, and more particularly to a semiconductor memory device or semiconductor memory circuit device characterized by high speed and high integration, and an information processing system provided with these circuits or devices.

2. Description of the Prior Art

A first prior art circuit is described in Japanese Patent Laid-Open NO. 61-293018 and Japanese Patent Laid-Open 62-186613. FIG. 18 is a sketch of this first prior art circuit.

According to this first prior art circuit, when the output signal 1809 of NMOS transistor (hereinafter referred to as "NMOS") 1806 is high, namely, (power potential)—(NMOS threshold voltage), the PMOS transistor (hereinafter referred to as "PMOS") 1810 prevents the breakthrough current of inverter 1812 from flowing and stabilizes the potential of output signal 1813.

Second prior art circuit are described in Japanese Patent Laid-open NO. 62-32722 and Japanese Patent Laid-open NO. 63-5172. FIGS. 19 and 20 are sketches of these second prior art circuits.

With reference to FIG. 19 illustrating one of the second prior art circuits, PMOS Q3 is a transistor for driving transistor when signals are applied to the gate from terminal 1905, in order to drive PMOS transistor Q1 if the input signal 1901 is high. When the input signal is low, transistor Q3 turns off and operates in such a way that the high level at point A will be applied to the NMOS transistor Q2 gate, without being applied to the gate of Q1, thereby serving to increase the switching speed between Q1 and Q2.

Similarly, when input signal 1901 is high, the level at point A is low in FIG. 20. NMOS transistor Q12 is off and NMOS Q14 is on; therefore, the level at point B is also low. Accordingly, PMOS transistor Q13 is turned to drive the NMOS transistor Q11. When the input signal 1901 is low, the level at point A is high, and NMOS Q14, PMOS Q13 and NMOS Q11 are turned off. After the NMOS Q12 turns on, the output signal level turns low. At this time, all the Q11, Q13 and Q14 are turned off; therefore, almost no current runs from the 2003.

That is, transistor Q14 functions as a switching element to switch the pull-down circuit and the pull-up circuit.

A third prior art circuit widely known as the memory cell circuit used in the CMOS gate array LSI in conventional semiconductor memory device, includes the circuit used for the memory unit of a 1W-1R (one-port write-in, one-port read-out), or that used for the memory unit of a 2W-2R (two-port write-in, two-port read-out). The data memory unit of the former is composed of a CMOS inverter and a clocked inverter. The data write-in side of the data memory unit is linked to the write data line through a pair of transfer gates, and the data read-out side is linked to the read data line through the clocked inverter. Each clocked inverter comprises two PMOS transistors and two NMOS transistors, and the entire memory cell circuit is made up of six PMOS transistors and six NMOS transistors.

The data memory unit of the latter, on the other hand, comprises a pair of clocked inverters, and the data write-in side of the data memory unit is linked to the write data line through a pair of transfer gates, while the data read-out side is linked to the read data line through the read-out clocked inverter. Each clocked inverter comprises two PMOS transistors and two NMOS transistors, and the transfer gate is made up of one PMOS transistor and one NMOS transistor. The entire memory cell circuit is made up of ten PMOS transistors and ten NMOS transistors.

The first prior art circuit has associated there with the following problem: When the potential of the clocked inverter 1809 of the NMOS transistor 1806 is high, breakthrough current flows to the inverter 1912 until feedback is applied by MOS transistor 1810.

This is because the high level of the output signal 1809 of NMOS transistor 1806 is reduced below the power potential by the threshold voltage of the NMOS transistor 1806.

Also first prior art circuit the following is at issue: When the potential of the output signal 1809 of NMOS transistor 1806 is reduced from a high to a low level, the potential must be changed from the power source potential to the grounding potential, and this takes more time than the time required to change from the high level of the intermediate potential (potential reduced from power supply potential by threshold voltage of NMOS transistor 1806) to the grounding potential.

The above recognized problem is caused by the PMOS transistor 1810, provided to avoid breakthrough current of the inverter 1812.

Unlike the circuit according to the present invention, the second prior art circuit provides a circuit where a high voltage circuit is driven by a low voltage CMOS circuit to produce high voltage signals.

This requires two or more different power supply voltages to be provided, resulting in a complicated structure of the power supply system.

Furthermore, according to the second prior art circuit, signals at point A are driven by the complementary circuit comprising transistors Q4 and Q5, and the potential at point A provides the same amplitude as that of the power supply voltage. Accordingly, the complementary circuit comprising transistors Q4 and Q5 has little effect in reducing power consumption since it reduces the charging and discharging current at point A. Furthermore, operation amplitude at point A is the same as that of power supply voltage, so it is less effective in increasing speed by reducing signal amplitude. Moreover, when the level o input signal 1901 is high, direct current will flow through R1, Q3 and Q4, and R1, Q14 and Q4, resulting in increased power consumption.

In the third prior art circuit, each six or ten PMOS transistors and six NMOS transistors are used to configure the memory cell circuit. When the basic cell is made up of two pairs of two-series PMOS transistors and two-series NMOS transistors (eight transistor in total), for example, the former requires a minimum of 1.5 BCs (basic cells), while the latter requires a minimum of 2.5 BCs (basic cells), resulting in increased area of the memory cell circuit. The read data line is linked to a read-out clocked inverter for each memory cell, and the read data line must be provided with an additional drain capacity for two transistors of the clocked inverter; PMOS transistor and NMOS transistor, causing the read data line load capacity and the memory access time to be increased.

One object of the present invention is to provide a semiconductor integrated circuit which operates at low power consumption from a single power supply without any breakthrough current, despite reception of input signals of low amplitude operation.

Another object of the present invention is to provide a semiconductor integrated circuit device where the input signal transition time is shortened by reducing the amplitude of input signals, and power consumption in a driver circuit to drive said input signals is reduced.

Still another object of the present invention is to provide a semiconductor memory device characterized by high speed and low power consumption, plus high memory density of the master slide type LSI such as gate array and embedded array.

A further object of the present invention is to provide a semiconductor integrated circuit device and semiconductor memory device, which allow reduction of the capacity to be added to the data line.

SUMMARY OF THE INVENTION

In the present invention, input signals are fed to a first NMOS transistor, and to a gate of a first PMOS transistor which performs a complementary operation with the first NMOS transistor through a second NMOS transistor. The gate of the first PMOS transistor is linked to the power supply potential through a second PMOS transistor, and the gate of the second NMOS transistor is linked to the power supply potential. The first NMOS transistor drain and said first PMOS transistor drain are commonly connected to the second PMOS transistor gate. Thus, in the present invention, control is provided by the signals fed through the said procedure.

When applied to the memory, another characteristic of the present invention is found as follows: The read-out port is single-ended, and the switch, which is turned on or off by the read-out word line level, is made of a single NMOS or PMOS transistor, not a clocked inverter.

Since the read-out switch is made of a single NMOS or PMOS transistor, the current drive force of the circuit of the gates which configure the memory cell memory unit and which drive the read data line is increased in order to avoid writing errors at the time of reading. The write-in port is designed to permit differential write-in or single end write-in. Since the read-out switch is made of a single NMOS or PMOS transistor, it is provided with the signal receiving circuit to feedback its own output signal and to control the pull-up MOS, in order to ensure that leak current will not flow in the circuit receiving the signal of the read data line, even if the read data line does not provide a full amplitude. The number of the transistors used in the memory cell circuit is determined in the case of the memory made up of the basic cells of the gate array, namely, the metallized memory, such that the number of PMOS transistors and the number of NMOS transistors will be equal to each other in order to eliminate any unwanted surplus.

To achieve the above stated objects, the present invention provides a semiconductor integrated circuit device having a single-ended, read-out port configuration. The device comprises: (1) a data memory unit wherein two or more inverter circuits are made up of two or more semiconductor elements, and each inverter circuit is connected to the other to configure a data memory closed loop, (2) a data input unit wherein the data memory unit is connected to the write data line by a write data transmission channel, which is opened or closed in response to the write-in signal by said data input unit, (3) a data output unit wherein the data memory unit is connected to the read data line by a read data transmission channel, which is opened or closed in response to the read-out signal by said the data output unit, and (4) a loop control unit, which opens the closed loop of the data memory unit at the time of data writing in response to the write-in signal and to close the closed loop of the data memory unit after writing the data; the data output unit being made up of a single MOSFET.

The semiconductor integrated circuit device having a singleended write-in port configuration comprises: (1) a data memory unit wherein two or more inverter circuits are made up of two or more semiconductor elements, and each inverter circuit is connected with the other to configure a data memory closed loop, (2) a data input unit wherein said data memory unit being connected to the write data line by a write data transmission channel, which is opened or closed in response to the write-in signal by said data input unit, (3) a data output unit wherein the data memory unit is connected to the read data line by a read data transmission channel, which is opened or closed in response to the read-out signal by said data output unit, and (4) a loop control unit which opens the closed loop of the data memory unit at the time of data writing in response to the write-in signal and to close the closed loop of the data memory unit after writing the data; wherein the data input unit is made up of a single MOSFET.

When configuring the said semiconductor integrated circuit, the read-out port and write-out port can each be made single-ended if each of the data input unit and data output unit is made up of a single MOSFET.

Next, the semiconductor integrated circuit device with consideration given to differential write-in operation comprises: (1) a data memory unit wherein two or more inverter circuits are made up of two or more semiconductor elements, and each inverter circuit is connected to the other to configure a data memory closed loop, (2) two or more data input units wherein the data memory unit being connected to two or more write data lines by a group of write data transmission channels, which are opened or closed in response to the write-in signal by said data input units, (3) a data output unit wherein the data memory unit is connected to the read data line by a read data transmission channel, which is opened or closed in response to the read-out signal by said data output unit; the data output unit being made up of a single MOSFET. In the configuration of this device, the data input unit can be made up of a single MOSFET, or in the alternative the data input unit and data output unit can each be made up of a single MOSFET.

Next, the semiconductor integrated circuit device) with consideration given to two-port write-in, two-port read-out;comprises: (1) a data memory wherein two or more inverter circuits are made up of two or more semiconductor elements, and each inverter circuit is connected to the other to configure a data memory closed loop, (2) two or more data input units wherein said data memory unit being connected to the write data line by two or more write data transmission channels, which are opened or closed in response to the write-in signal by said data input units, (3) two or more data output units wherein the data memory unit is connected with the read data line by two or more read data transmission channels, which are opened or closed in response to the read-out signal by said data output units, and (4) a loop control unit which opens the closed loop of each data memory unit at the time of data writing in response to the write-in signal and to close the closed loop of the data memory unit, after writing the data; the data input units each being made of a single MOSFET. In configuration of this device, the data input unit can be made up of a single MOSFET, or alternatively the data input unit and data output unit can each be made of a single MOSFET.

In configuration of this device, of the inverter circuits of the data memory unit, those connected to the read data line through the data output unit when reading out the data are preferred to have the output impedance smaller than other inverter circuits.

In configuration of this device, it is preferred that the device has data memory units for two or more bits, with one data memory unit as the data memory area for one bit, and units related to the input and output of the data of each data memory unit be each provided for two or more bits. It is further preferred that the MOSFET group connected to the read data line be divided for each adjacent pair of MOSFETs, and the output terminal of each pair of the MOSFETs be formed in the common area adjacent to the read data line.

Next, the semiconductor integrated circuit device having memory circuits for two or more bits with the single-ended read-out port comprises (1) a data memory unit wherein two or more inverter circuits are made of two or more semiconductor elements, and each inverter circuit is connected to the other to configure a data memory closed loop, (2) a data input unit wherein said data memory unit being connected to the write data line by a write data transmission channel, which is opened or closed in response to the write-in signal by said data input unit, (3) a data output unit wherein the data memory unit is connected to the read data line by a read data transmission channel, which is opened or closed in response to the read-out signal by said data output unit, and (4) a loop control unit which opens the closed loop of the data memory unit at the time of data writing in response to the write-in signal and to close the closed loop of the data memory unit after writing the data. With this configuration equivalent to one bit, the units are provided for two or more bits, and the data memory unit, data input unit, data output unit and loop control unit are each made up of a MOSFET, with the data output unit being composed of a single MOSFET. In the configuration of this device, the data input unit can be composed of a single MOSFET, or alternatively the data input unit and the data output unit can each be made of a single MOSFET.

Next, the semiconductor integrated circuit device having memories for two or more bits with differential write-in taken into account comprises: (1) a data memory unit two or more inverter circuits are made of two or more semiconductor elements, and each inverter circuit is connected to the other to configure a data memory closed loop, (2) two or more data input units wherein the data memory unit is connected to two or more write data line by a group of write data transmission channels, which is opened or closed in response to the write-in signal by said data input units, (3) a data output unit wherein the data memory unit is connected to the read data line by a read data transmission channel, which is opened or closed in response to the read-out signal by said data output unit. With this configuration equivalent to one bit, this units are provided for two or more bits, and the data memory unit, data input unit, and data output unit are each made up of a MOSFET, with the data output unit being composed of a single MOSFET. In the configuration of this device, the data input unit can be composed of a single MOSFET, or the data input unit and the data output unit can each be made of a single MOSFET.

Next, the semiconductor integrated circuit device having memories for two or more bits with two-port write-in and two-port read-out taken into account comprises: (1) a data memory unit wherein two or more inverter circuits are made of two or more semiconductor elements, and each inverter circuit is connected to the other to configure a data memory closed loop, (2) two or more data input units wherein said data memory unit is connected to the write data line by two or more write data transmission channels, which are opened or closed in response to the write-in signal by said input units, (3) a data output unit wherein the data memory unit is connected to the read data line by a read data transmission channel, which is opened or closed in response to the read-out signal by said data output unit, and (4) a loop control unit which opens the closed loop of the data memory unit at the time of data writing in response to the write-in signal and to close the closed loop of the data memory unit after writing the data. With this configuration equivalent to one bit, the units are provided for two or more bits, and said data memory unit, data input unit, data output unit and loop control are each made of a MOSFET, with said data output unit being composed of a single MOSFET. In the configuration of this device, the data input unit can be composed of a single MOSFET, or the data input unit and the data output unit can each be made of a single MOSFET.

When configuring the device with consideration given to memories for two or more bits, of the inverter circuits of the data memory unit, those connected to the read data line through the data output unit when reading out the data are preferred to have the output impedance smaller than other inverter circuits.

In configuring the device with consideration given to memories for two or more bits, of the inverter circuits of the data memory unit, those connected to the read data line through the data output unit when reading out the data are preferred to be composed of two or more P type MOSFET and a single N type MOSFET, and each P type MOSFET is preferred to be parallel connected with the other.

When configuring the memories for two or more bits, it is preferred that the MOSFET group linked to the read data line be divided for each adjacent pair of MOSFETs, and the output terminal of each pair of the MOSFETs be formed in the common area adjacent to the read data line.

Furthermore, when configuring the device with memories for two or more bits taken into account, it is By preferred that the device be composed of: (1) a first P type MOSFET and a first N type MOSFET which are provided with a level shift unit to shift a level of a read data line signal between a read data line and a read data output terminal to output it to the read data output terminal, the level shift unit being inserted between the read data line and read data output terminal to configure the inverter circuit, (2) a second N type MOSFET connected to the gate power supply terminal by the source drain path formed between the gate of the first P type MOSFET and the read data line, (3) a second P type MOSFET where the gate is grounded by the source drain path formed between the power supply terminal and the gate of the first P type MOSFET, and (4) a third P type MOSFET where the gate is connected to the read data output terminal by the source drain path formed between the first P type MOSFET gate and second P type MOSFET source drain path. It is further preferred that the first N type MOSFET gate be connected to the read data line, part of the first N type MOSFET source drain path be grounded, and part of the first P type MOSFET source drain path be connected to the power supply terminal.

Operation of the Invention

According to a first characteristic, the gate of the first NMOS transistor has a low level, and turns off when the input signal level is low. At the same time, input signal is fed to the gate of the first PMOS transistor through second NMOS transistor, causing the first PMOS transistor to be turned off. As a result, the drain potential which is a gate signal of the second PMOS transistor and which is commonly linked to the first NMOS transistor and the first PMOS transistor goes high, causing the second PMOS transistor to be turned off. This requires, however, that the impedance when shifting to the low level the gate potential of the first PMOS transistor be sufficiently lower than that of the second PMOS transistor.

When input signal level is high, the first NMOS transistor turns on since the gate level is high. At the same time, input signal is fed to the first PMOS transistor gate through the second NMOS transistor. However, the potential does not rise to the power supply potential; therefore, the first PMOS transistor does not turned off completely. When the drain commonly connected to the first NMOS transistor and the first PMOS transistor goes closer to the low level, however, the second PMOS transistor will actuate the feedback circuit, and the first PMOS transistor turns off as a result of the gate potential rising to the power supply potential.

It is further possible to ensure a semiconductor integrated circuit which operates at a low power consumption without DC breakthrough current even when the high level of said input signal is intermediate.

Furthermore, it is possible to reduce the power consumption the driver circuit which drives the input signal and to increase the speed by reducing the amplitude of input signal.

The greater the input signal load capacity, the more conspicuous will be these effects.

According to the second characteristic of the present invention, if the memory is configured so that the read-out port is single-ended, and the switch which is turned on or off by the read-out word line level is made of a single NMOS or PMOS transistor, not a clocked inverter, then it is possible to reduce the number of the transistors used in the memory cell circuit and to decrease the load capacity applied to the read data line, resulting in ensuring a high speed access.

The read-out switch is made of a single NMOS or PMOS transistor, and the potential of the read data line will affect the memory cell. However, writing errors in reading can be prevented by raising the current drive force of the gate circuit which configures the memory cell storage unit drives the read data line. The write-in port is designed to permit differential write-in or single end write-in.

In the case of the memory made up of the basic cells of the gate array, namely, the metallized memory, the number of the transistors used in the memory cell circuit can be determined to provide an effective configuration and to eliminate the excessive number of the MOS transistors of the basic cell, by ensuring that the number of PMOS transistors and that of NMOS transistors will be equal to each other.

In the present invention discussed above, the read-out port is designed single-ended, so the data output unit can be made up of a single MOSFET. Since the write-in port is single ended, the data input unit can be made up of a single MOSFET, thereby reducing the number of transistors constituting the memory cell circuit and decreasing the load capacity applied to the read data line or write data line, resulting in ensuring a high speed access.

Furthermore, when the read-out port is composed of a single MOSFET, the read data line potential affects the memory cell when the data is read out. However, to raise the current drive force, it is possible to configure so that the inverters constituting the data memory unit and driving the read data line have a smaller output impedance that other inverters. It is also possible to prevent the inverter value from being reversed by the data line potential when the data is read out, since PMOSFETs are connected in parallel in some of the CMOS inverters. When the device is designed with consideration given to differential writing, the present invention allows the data to be written from the write-in port. Furthermore, when a metallized memory is configured, the present invention provides an effective configuration, and to eliminate the excessive number of the MOS transistors of the basic cell, by ensuring that the number of PMOS transistors and that of NMOS transistors will be equal to each other.

DESCRIPTION OF THE PREFERRED EMBODIMENTS

The following describes the preferred embodiments of the present invention with reference to the diagrams, where the same numbers are assigned to the same parts.

Figure 1A:
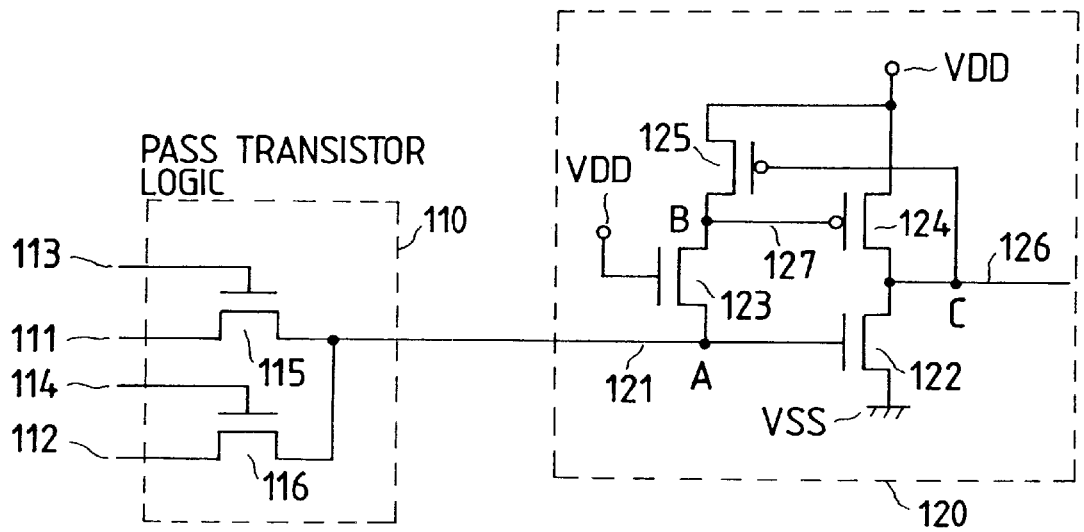
FIG. 1A is a diagram representing the first embodiment of the present invention.

FIG. 1A is a diagram representing a first embodiment of the present invention.

In the diagram, 110 denotes an example of the pass transistor logic. The pass transistor logic 110 configures a 2-input selector through NMOS transistors 115 and 116. In the diagram, 111 and 112 denotes input signals, while 113 and 114 therefor represent control signals.

In the diagram, 120 represents a semiconductor integrated circuit according to the present invention, 121 an input signal, 122 and 123 NMOS transistors, and 124 and 125 PMOS transistors. The 126 is an output signal from semiconductor integrated circuit 120, and 127 is a gate signal of the PMOS transistor 124. The VDD signifies power supply potential, while VSS shows ground potential.

The following describes the operations in FIG. 1A:

Assume that control signal 113 of the pass transistor logic 110 is high, while control signal 114 is low. Input signal 111 is transmitted to input signal 121 of the semiconductor integrated circuit 120 through NMOS transistor 115.

If the input signal 111 of pass transistor logic 110 is low (ground potential), NMOS transistor 122 will turn off, and the potential of the gate signal 127 of PMOS transistor 124 shifts to the low level through NMOS transistor 123. This will cause PMOS transistor 124 to be turned on, resulting in output signal 126 going high.

In this case, NMOS transistor 122 and PMOS transistor 125 are completely off; therefore, DC breakthrough current does not flow to semiconductor integrated circuit 120.

When input signal 111 of pass transistor logic 110 is high (power supply potential), input signal 121 of semiconductor integrated circuit 120 will have the potential lower than power supply potential by threshold voltage of the NMOS transistor 115. At the same time, the potential of gate signal 127 of PMOS transistor 124 increases up to that of the input signal 121, and PMOS transistor 124 continues to emit very small current, without being completely turned off. Output signal 126 goes low under this condition, accompanied by PMOS transistor 125 being turned off. The PMOS transistor 124 is completely turned off when the potential of gate signal 127 has risen to the power supply potential.

Since PMOS transistor 124 and NMOS transistor 123 are off in this case, no DC breakthrough current flows to semiconductor integrated circuit 120.

In the embodiment shown in FIG. 1A, the present invention realizes the semiconductor integrated circuit of low power consumption where no DC breakthrough current flows, even if the high level of semiconductor integrated circuit input signal is made to operated at a low amplitude. It is also possible to operate the driver circuit at a low power consumption which drives the input signal at a low amplitude.

Figure 1B:
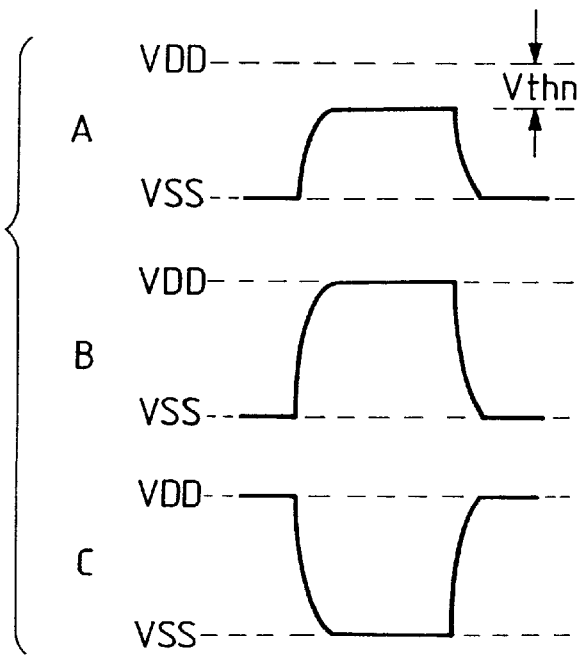
FIG. 1B is a diagram representing the waveform in various nodes of the first embodiment.

FIG. 1B shows the waveform in various nodes, where the VDD signifies power supply potential, while VSS shows ground potential.

The high level of node A is lower than power supply potential by the threshold voltage (Vth) of the NMOS transistor since it is charged by the NMOS transistor. The low level is the ground potential since it is discharged by the NMOS transistor.

The high level of node B is the power supply potential since it is charged by the PMOS transistor 125. The low level is the ground potential since it is discharged by the NMOS transistor.

The node C fluctuates between the power supply potential and the ground potential since it is charged by the PMOS transistor 124 and is discharged by the NMOS transistor 122.

Figure 2:
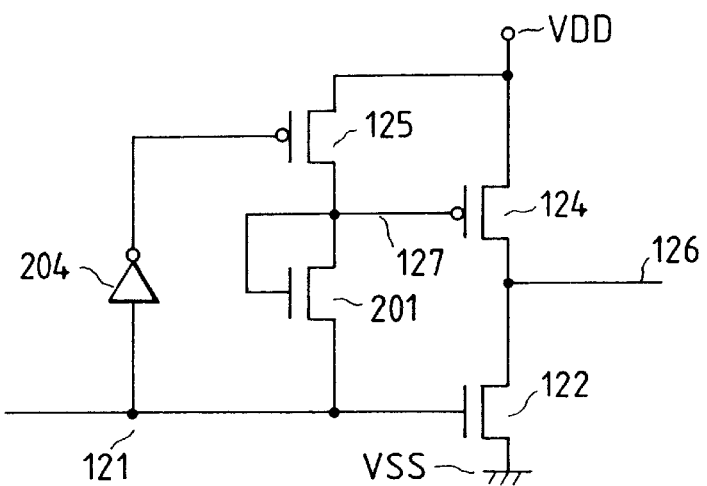
FIG. 2 is a diagram representing the second embodiment of the present invention.

FIG. 2 represents the second embodiment of the present invention.

The difference from the embodiment 120 in FIG. 1A is that the gate of the PMOS transistor 125 is controlled by the signal gained by reversing input signal 121 by inverter circuit 204, and that the drain and gate of NMOS transistor 201 provided between input signal 121 and the gate of PMOS transistor 124 are shortcircuited.

The inverter circuit 204 reverses the input signal 121 to control the gate of PMOS transistor 125. When input signal 121 is low, PMOS transistor 125 turns off, and operation is performed to ensure quick shift of the potential of gate signal 127 of PMOS transistor 124 to the low level as soon as possible. Furthermore, when input signal 121 is high, PMOS transistor 125 turns on, causing the potential of gate signal 127 of PMOS transistor 124 to be charged up to power supply potential.

When input signal 121 is low, gate signal of PMOS transistor 124 is discharged down to the potential which is higher than the ground potential by threshold voltage of NMOS transistor 201.

When input signal 121 is low, PMOS transistor 125 turns off. Except for the above description, the operation is the same as that of the first embodiment shown in FIG. 1A.

In the embodiment shown in FIG. 2, the on-off operation of PMOS transistor 125 can be controlled from input signal 121 through inverter circuit 204. So when input signal 121 is shifted from the low level, there is no contention with the PMOS transistor 125. This makes it possible to quickly operate the semiconductor integrated circuit shown in FIG. 2 at a lower power consumption than in the case of the embodiment shown in FIG. 1A.

Furthermore, according to this embodiment, the voltage of gate signal 127 of PMOS transistor 124 fluctuates between the power supply potential and the potential which is higher than the ground potential by threshold voltage of NMOS transistor 201.

This is because, when input signal 121 is low, voltage between the gate and source of PMOS transistor 124 is reduced, causing the drive force of the PMOS transistor 124 to be reduced.

Figure 3:
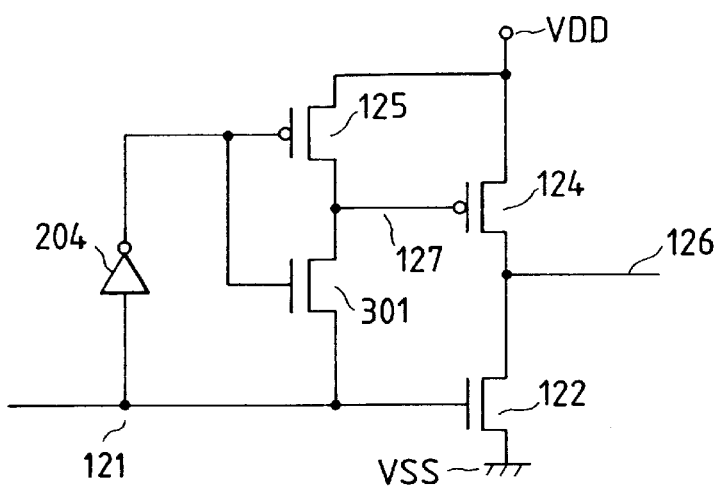
FIG. 3 is a diagram representing the third embodiment of the present invention.

FIG. 3 shows the third embodiment of the present invention. The difference from the embodiment in FIG. 2 is that the gate of the NMOS transistor 301 is controlled by the output signal inverter 204.

When the input signal 121 is low, the output of inverter 204 is high, and the PMOS transistor 125 turns off, while the NMOS transistor 301 turns on. Accordingly, the gate potential of PMOS transistor 124 goes low, and PMOS transistor 124 turns on. In this case, NMOS transistor 122 turns off, and output signal 126 is charged to the high level.

When the input signal 121 is high, the output signal of inverter 204 is reduced to the low level, and PMOS transistor 125 turns on, while the NMOS transistor 301 turns off. Therefore, the gate potential of PMOS transistor 124 reaches the power supply potential, and PMOS transistor 124 turns off. In this case, NMOS transistor 122 turns on, and output signal 126 is discharged to the low level.

In the embodiment shown in FIG. 3, the gates of the PMOS transistor 125 and NMOS transistor 301 are controlled by the same signal. This prevents the PMOS transistor 125 and NMOS transistor 301 from turning on simultaneously; therefore, prevents breakthrough current from flowing from the VSS through PMOS transistor 125 and NMOS transistor 301 when the input signal 121 is low.

Figure 4:
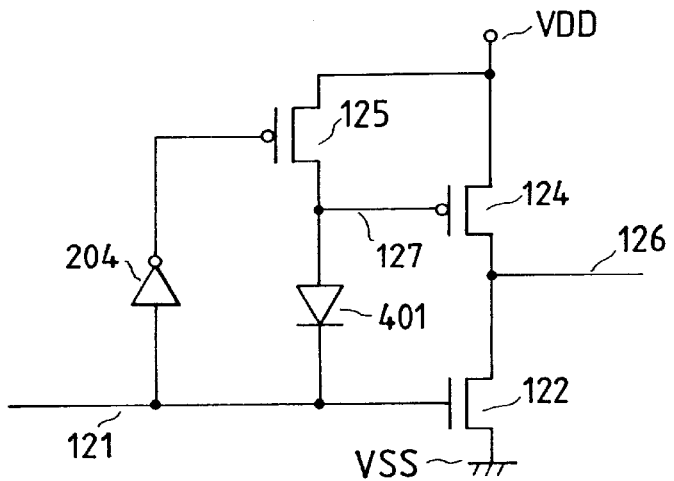
FIG. 4 is a diagram representing the fourth embodiment of the present invention.

FIG. 4 represents the fourth embodiment of the present invention.

The difference from the embodiment in FIG. 2 is that diode 401 is provided between input signal 121 and the gate of PMOS transistor 124.

When input signal 121 is low, the gate potential of the PMOS transistor 124 is discharged through diode 401 to reach the potential which is higher than the ground potential by the builtin voltage of diode 401.

When input signal 121 is high, the gate potential of the PMOS transistor 124 is raised to the power supply potential by the PMOS transistor 125.

Except for the above description, the operation is the same as that of the embodiment shown in FIG. 2.

In the embodiment shown in FIG. 4, the voltage of gate signal 127 of PMOS transistor 124 fluctuates between the power supply potential and the potential which is higher than the ground potential by the built-in voltage of the diode 401.

Similar to the case of the embodiment shown in FIG. 2, when input signal 121 is low, the gate-source voltage of the PMOS transistor 124 is reduced, thereby reducing the drive force of PMOS transistor 124.

Figure 5:
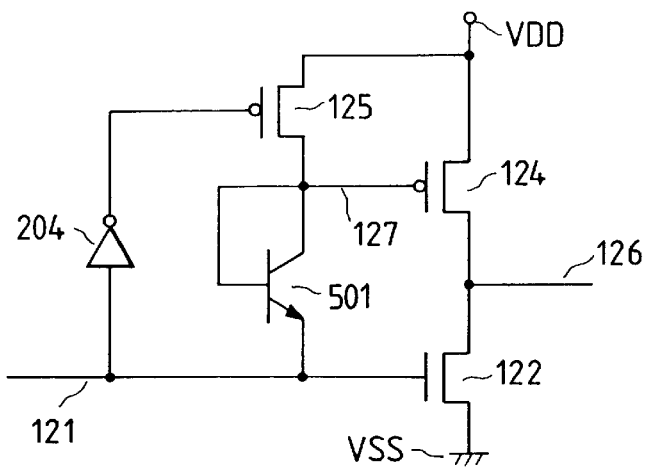
FIG. 5 is a diagram representing the fifth embodiment of the present invention.

FIG. 5 represents the fifth embodiment of the present invention.

The difference from the embodiment in FIG. 4 is that NPN bipolar transistor 501 shortcircuited between the base and emitter is provided between input signal 121 and the gate of PMOS transistor 124.

When input signal 121 is low, the gate potential of PMOS 124 is discharged through NPN bipolar transistor 501, and is reduced down to potential which is higher than the ground voltage by the voltage between the base and emitter of NPN bipolar transistor 501.

When the input signal 121 is high, NPN bipolar transistor 501 turns off, and the gate potential of PMOS transistor 124 is raised to the power supply potential by PMOS transistor 125.

Except for the above description, the operation is the same as that of the embodiment shown in FIG. 4.

In the embodiment shown in FIG. 5, the potential of gate signal 127 of PMOS transistor 124 fluctuates between the power supply potential and the potential which is higher than the ground potential by the voltage between the base and emitter of NPN bipolar transistor 501.

Similar to the case of the embodiment shown in FIG. 4, when input signal 121 is low, the gate-source voltage of the PMOS transistor 124 is reduced, thereby reducing the drive force of PMOS transistor 124.

Figure 6:
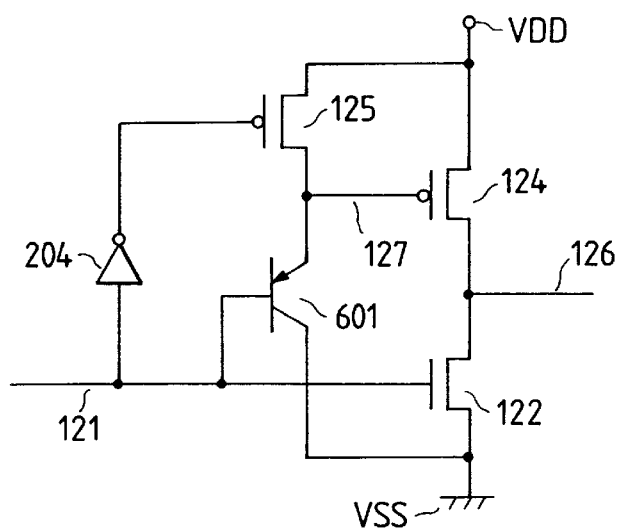
FIG. 6 is a diagram representing the sixth embodiment of the present invention.

FIG. 6 shows the sixth embodiment of the present invention.

The difference from the embodiment in FIG. 5 is that NPN bipolar transistor 601 is provided between input signal 121 and the gate of PMOS transistor 124.

When input signal 121 is low, the gate potential of PMOS transistor 124 is discharged through NPN bipolar transistor 601, and is reduced down to the potential which is higher than the ground voltage by the voltage between the base and emitter of NPN bipolar transistor 601.

When the input signal 121 is high, NPN bipolar transistor 601 turns off, and the gate potential of PMOS transistor 124 is raised to the power supply potential by PMOS transistor 125.

Except for the above description, the operation is the same as that of the embodiment shown in FIG. 5.

In the embodiment shown in FIG. 6, the potential of gate signal 127 of PMOS transistor 124 fluctuates between the power supply potential and the potential which is higher than the ground potential by the voltage between the base and emitter of NPN bipolar transistor 501.

Similar to the case of the embodiment shown in FIG. 5, when input signal 121 is low, the gate-source voltage of the PMOS transistor 124 is reduced, thereby reducing the drive force of PMOS transistor 124.

Figure 7:
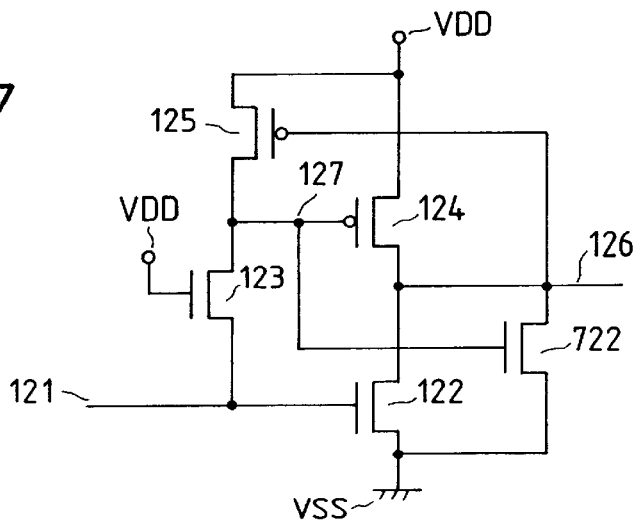
FIG. 7 is a diagram representing the seventh embodiment of the present invention.

FIG. 7 represents the seventh embodiment of the present invention.

The difference from the embodiment 120 in FIG. 1A is found in the addition of NMOS transistor 722.

The NMOS transistor 722 is intended to increase the speed at which the potential of output signal 126 goes low. Namely, when the input signal 121 is high (intermediate potential lower than the power supply potential by a certain voltage), it compensates for the reduction in the drive force of NMOS transistor 122 resulting from reduced voltage between gate and source of NMOS transistor 122.

Except for the above description, the operation is the same as that of the embodiment shown in FIG. 1A.

In the embodiment shown in FIG. 7, NMOS transistor 722 serves to reduce the rise time of output signal 126, as discussed above.

Figure 8:
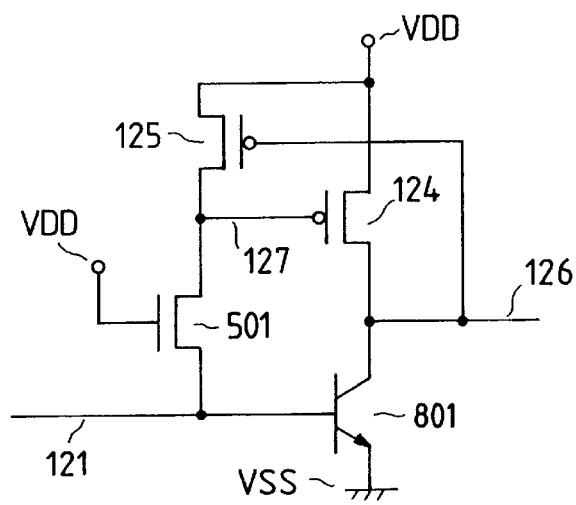
FIG. 8 is a diagram representing the eighth embodiment of the present invention.

FIG. 8 represents the eighth embodiment of the present invention.

The difference from the embodiment 120 in FIG. 1A is found in replacing NMOS transistor 122 by NPN bipolar transistor 801.

The NPN bipolar transistor 801 turns on when input signal 121 is high, and turns off when input signal 121 is low.

The bipolar transistor provides a higher drive force than the MOS transistor; therefore, when input signal 121 is high, it allows output signal 126 to go low at a high speed. This will cause the PMOS transistor 125 to be turned on quickly, and the PMOS transistor 124 to be turned off quickly.

Except for the above description, the operation is the same as that of the first embodiment shown in FIG. 1A.

In the embodiment shown in FIG. 8, NPN bipolar transistor 801 serves to reduce time for output signal 126 to go low.

Figure 9:
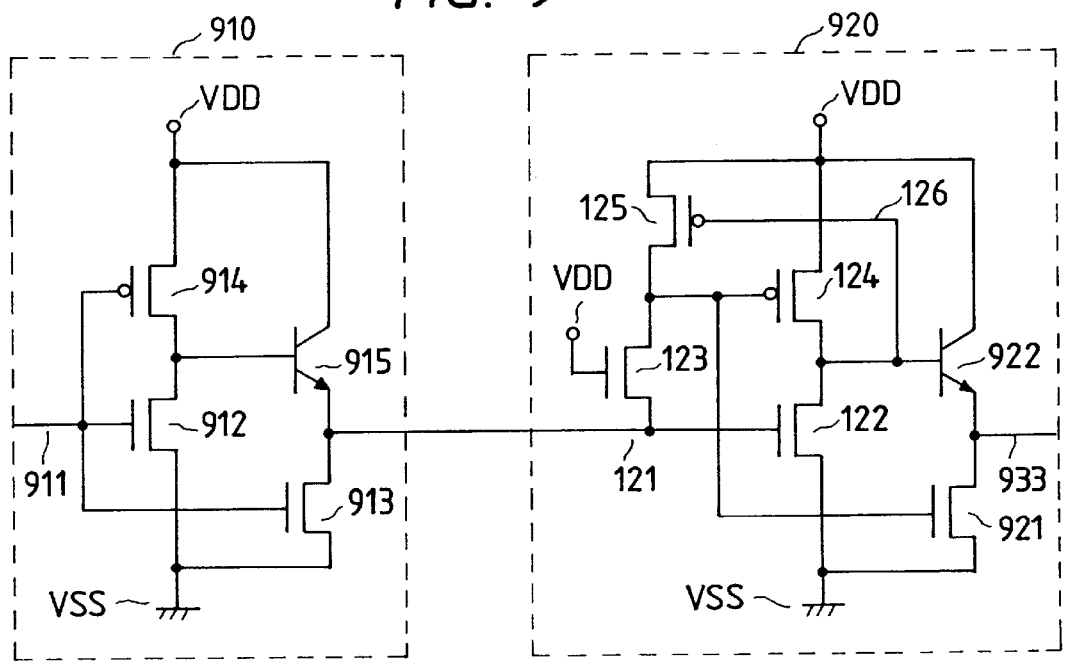
FIG. 9 is a diagram representing the ninth embodiment of the present invention.

FIG. 9 represents the ninth embodiment of the present invention. In the diagram, 910 denotes a Bi-NMOS gate circuit and 920 represents a semiconductor integrated circuit according to the present invention.

911 denotes input signal of Bi-NMOS gate circuit 910, and 912 and 913 signify a NMOS transistor; 914 shows a PMOS transistor, with 915 denoting a bipolar transistor. 921 represents a NMOS transistor, and 922 shows bipolar transistor, with 933 denoting the output signal of semiconductor integrated circuit 920.

The following describes the operations in FIG. 9.

The Bi-NMOS gate circuit 910 has been introduced in many literatures, and will not be described here. The following describes the semiconductor integrated circuit 920:

When input signal 121 is low, NMOS transistors 122 and 921 are turned off. When input signal 121 is transmitted through NMOS transistor 123 and turns on, PMOS transistor 124 turns on the bipolar transistor 922, causing output signal 933 to go high (to the potential lower than the power supply voltage by voltage between the base and emitter).

When input signal 121 is high, NMOS transistor 122 turns on, PMOS transistor 124 is turned off by the input signal transmitted through NMOS transistor 123. However, since the high level of input signal 121 is driven by the Bi-NMOS gate, it is lowered from the power supply potential by voltage between the base and emitter of bipolar transistor 915. The PMOS transistor 124 is not completely turned off. But it is completed turned off when the positive feedback circuits of PMOS transistor 124 and PMOS transistor 125 have operated as the potential of output signal 126 goes low. This causes the bipolar transistor 922 to be turned off, and the NMOS transistor 921 to be turned on, with output signal 933 going low.

According to the embodiment shown in FIG. 9, the present invention provides a low-consumption, high-speed Bi-NMOS semiconductor integrated circuit which is characteristic of the present invention.

Figure 10:
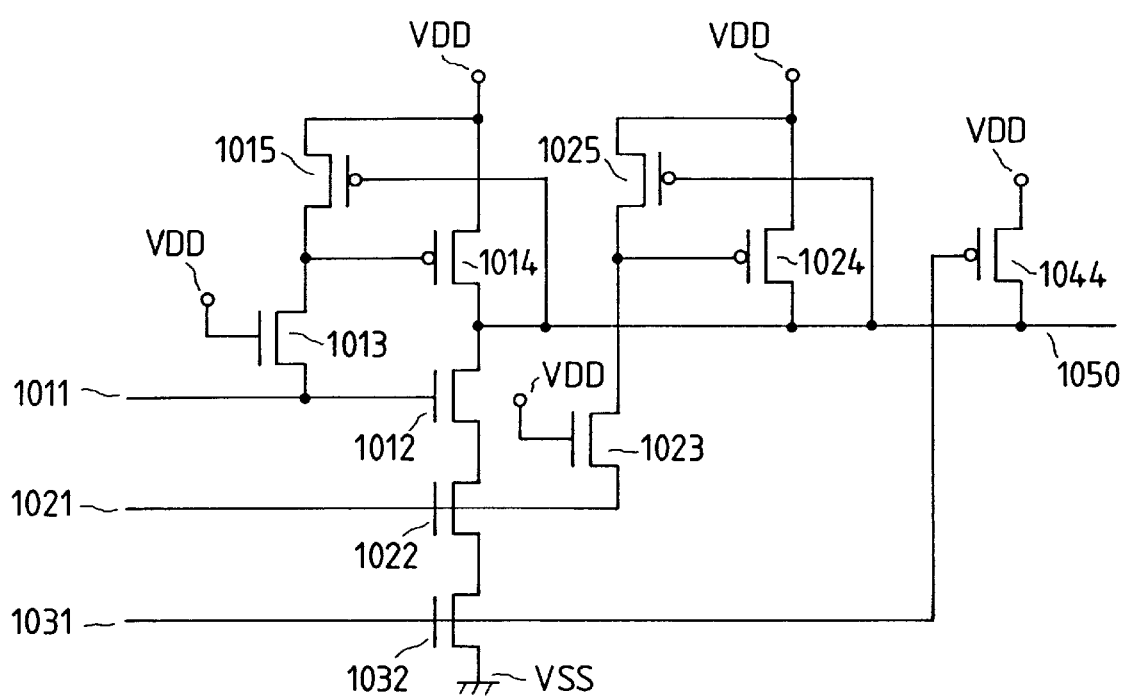
FIG. 10 is a diagram representing the tenth embodiment of the present invention.

FIG. 10 represents the tenth embodiment of the present invention. In the diagram, 1011 and 1021 denote input signals, and their signal amplitude is such that the low level is equivalent to ground potential, while the high level is equivalent to the intermediate potential which is lower than power supply potential by a certain voltage. 1031 is an input signal, and its signal amplitude covers the full range from the ground potential to the power supply potential.

1012, 1013, 1022, 1023 and 1032 denote NMOS transistors, while 1014, 1015, 1024, 1025 and 1044 represent PMOS transistors, with 1050 representing a signal.

The present embodiment uses as low amplitude input signal the semiconductor integrated circuit 120 according to the present invention shown in FIG. 1A, and as full amplitude input signal the normal CMOS circuit, thereby constituting a three-input NAND circuit.

In the embodiment shown in FIG. 10, even when the input signal amplitude is mixed between low amplitude operation and full amplitude operation, the present invention realizes a multi-input logic gate circuit featuring low consumption, high speed operation.

Figure 11A:
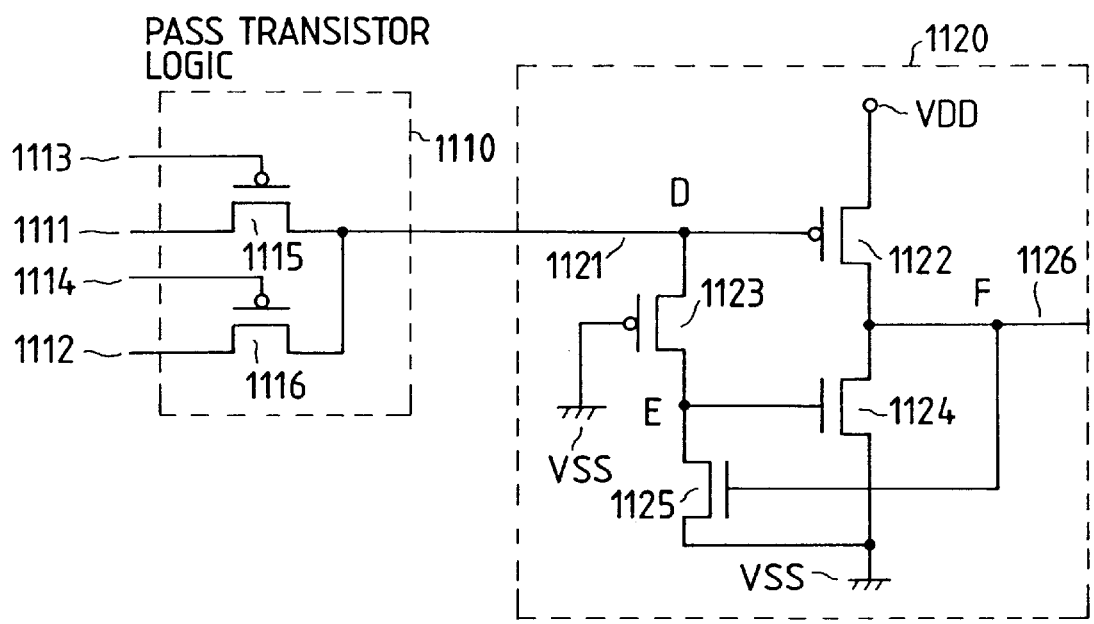
FIG. 11A is a diagram representing the eleventh embodiment of the present invention.

FIG. 11A represents the eleventh embodiment of the present invention. In the drawing, 1110 denotes an example of the pass transistor logic. The pass transistor logic 1110 with NMOS transistors 1115 and 1116 configure a two-input selector. In the diagram, 1111 and 1112 denote input signals, while 1113 and 1114 signify control signals.

In the diagram, 1120 denotes semiconductor integrated circuit 1121 according to the present invention. 1121 denotes an input signal, 1122 and 1123 represent PMOS transistors, 1124 and 1125 represent NMOS transistors, and 1126 indicates an output signal.

The present embodiment shows the case where the signal amplitude of input signal 1121 fluctuates between the low level (the potential which is higher than the ground potential by the threshold voltage of the PMOS transistor) and the high level (the power supply potential).

The Following Describes the Operation of the Present Embodiment:

When input signal 1121 is low (potential which is higher than the ground potential by threshold voltage of the PMOS transistor), PMOS transistor 1122 turns on, and NMOS transistor 1124 receives input signal 1121 through PMOS transistor 1123 to be turned on.

In this case, the gate potential of NMOS transistor 1124 does not go down to the ground potential, so NMOS transistor 1124 is not completely turned off. But it is completed turned off when the feedback circuits of NMOS transistors 1125 and 1124 have actuated as the potential of output signal 1126 goes high. Then output signal 1126 rises to the power supply potential.

When the input signal is high (power supply potential), PMOS transistor 1122 turns off and NMOS transistor 1124 turns on, resulting in output signal 1126 going low. This causes NMOS transistor 1125 to be turned off.

The present embodiment performs operations which are completely the reverse of the operations performed by the semiconductor integrated circuit 120 shown in FIG. 1A. Namely, when input signal 1121 is low, the PMOS transistor 1123 and NMOS transistor 1124 turn off. When input signal 1121 is high, the PMOS transistor 1122 and NMOS transistor 1125 turn off.

In the embodiment shown in FIG. 11A, even when the low input signal level is actuated at a low amplitude, the present invention realizes a semiconductor integrated circuit featuring low consumption, without flow of DC breakthrough current. The driver circuit to drive the low amplitude input signal can be operated at a low power consumption.

Figure 11B:
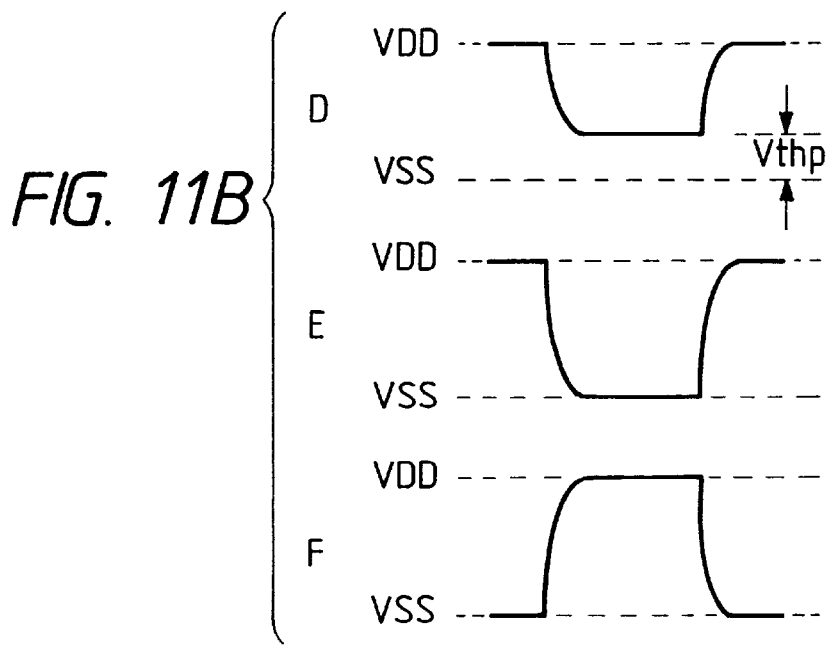
FIG. 11B is a diagram representing the waveform in various nodes of the eleventh embodiment.

FIG. 11B represents the voltage amplitude in various nodes of circuits shown in FIG. 11A.

The high level of node D is the power supply potential since it is charged by the PMOS transistor. The low level is the potential which is higher than the ground potential by the threshold voltage of the PMOS transistor (Vthp) since it is discharged by the PMOS transistor.

The high level of the node E is the power supply voltage since it is charged by PMOS transistor 1123, while the low level is the ground potential since it is discharged by NMOS transistor 1125.

Node F is charged by PMOS transistor 1122, and is discharged by NMOS transistor 1124, so it fluctuates between power supply potential and ground potential.

Figure 12:
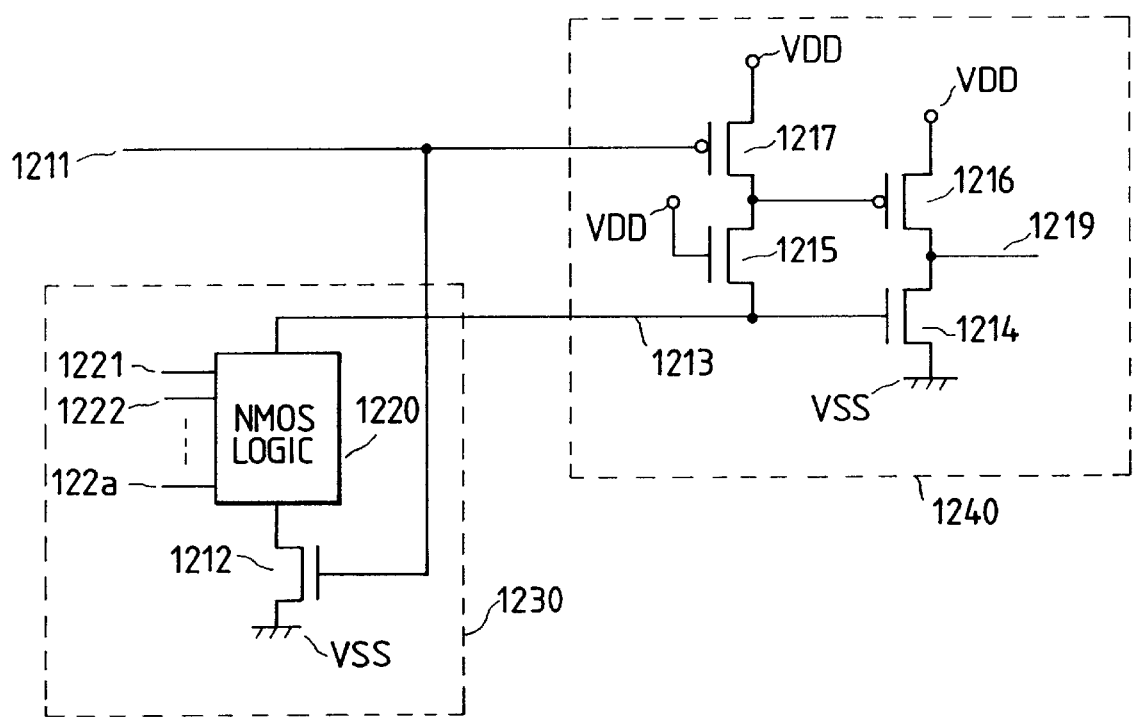
FIG. 12 is a diagram representing the twelfth embodiment of the present invention.

FIG. 12 represents the twelfth embodiment of the present invention.

1211 denotes a clock signal, 1220 shows a logic circuit comprising the NMOS transistor to enter input signals 1221, 1222 and 122n. 1213 represents an output node of logic circuit 1220, and 1212, 1214 and 1215 are NMOS transistors, while 1216 and 1217 are PMOS transistors, with 1219 denoting output signal. 1230 is a transmitter circuit, and 1240 signifies a receiver circuit.

The Following Describes the Operations of the Present Embodiment:

When clock 1211 is low, NMOS transistor 1212 turns off, and PMOS transistor 1217 turns on. The gate of PMOS transistor 1216 is precharged to the power supply potential, and the output node 1213 of the logic circuit 1220 is precharged to the potential which is lower than the power supply potential by threshold voltage of NMOS transistor 1215. In this case, PMOS transistor 1216 turns off, and NMOS transistor 1214 turns on; therefore, output signal 1219 goes low. Despite the output node 1213 of logic circuit 1220 being an intermediate potential, no DC breakthrough current flows to the semiconductor integrated circuit since the gate signal of PMOS transistor 1216 is at the power supply potential.

When clock signal 1211 is high, NMOS transistor 1212 turns on and PMOS transistor 1217 turns off. Namely, the system determines whether the high level of the output node 1213 of the logic circuit 1220 and the gate signal of PMOS transistor 1216 should be maintained by according to the result of logic circuit 1220 or should go low.

If the output node 1213 of logic circuit 1220 is kept high, output signal 1219 remains low. If output node 1213 of logic circuit 1220 goes low, NMOS transistor 1214 turns off and PMOS transistor 1216 turns on, resulting in output signal 1219 going high. In this case, NMOS transistor 1214 and PMOS transistor 1217 are completely off and, there is no DC breakthrough current.

In the embodiment shown in FIG. 12, output node 1213 is made to go high by PMOS transistor having a weak drive force. Since the logic circuit can be formed by NMOS transistor having a greater drive force than PMOS transistor, it is possible to increased the speed of the circuit operation.

Since the high level of output node 1213 is an intermediate potential, there is an advantage that the output signal 1219 can be driven by the PMOS transistor 1216 which gate signal exhibits a full amplitude, rather than by the NMOS transistor 1214,inferior in drive force.

Namely, similar to the embodiments discussed so far, the present embodiment has an advantage of realizing low power consumption and high speed. The advantages shown above are more conspicuous as the load capacity of output node 1213 is made higher.

Figure 13:
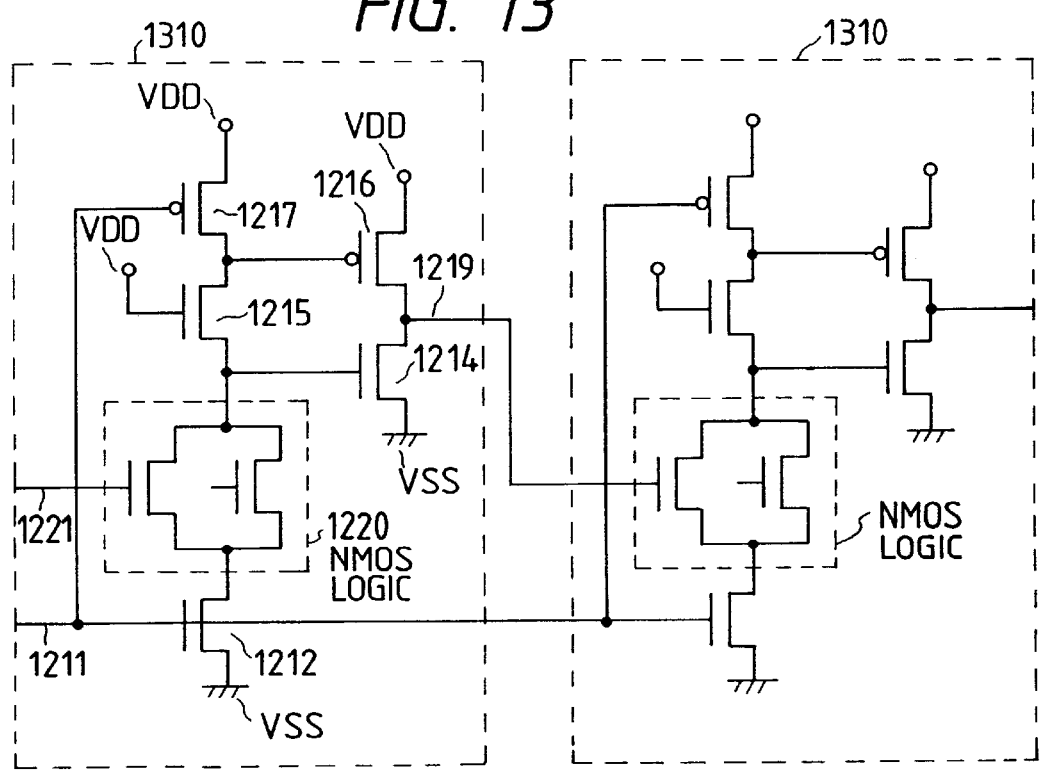
FIG. 13 illustrates an example where the present invention is applied to the domino circuit.

FIG. 13 represents the thirteenth embodiment of the present invention.

The present embodiment shows an example of constituting the domino circuit by connecting the embodiments shown in FIG. 12 in multiple stages.

In the diagram, 1310 denotes an example of the two-input circuit in which, the interior of logic circuit 1220 comprises two NMOS transistors connected in parallel.

According to the embodiment shown in FIG. 13, the present invention allows semiconductor integrated circuit according to the present invention to be connected in multiple stages , thereby configuring a logic system featuring still lower power consumption and higher speed.

Figure 14:
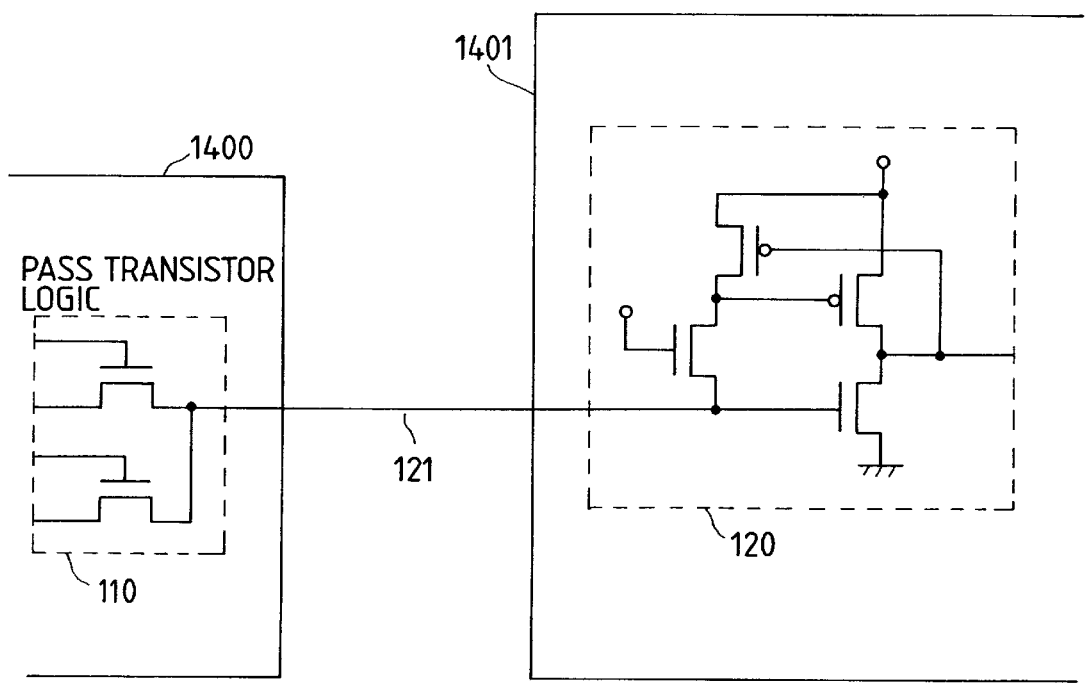
FIG. 14 illustrates an example where the present invention is applied to the interface between circuit blocks.

FIG. 14 represents the fourteenth embodiment of the present invention.

In the diagram, 1400 and 1401 denote the first and second circuit blocks physically separated inside the semiconductor integrated circuit, and 121 is a low amplitude bus to connect between the circuit blocks 1400 and 1401.

According to the present embodiment, the present invention provides low power consumption and high speed in signal transmission between circuit blocks by application of the present invention to the heavily loaded wire connecting between circuit blocks, and to the signal transmitter circuit and receiver circuit.

Figure 15:
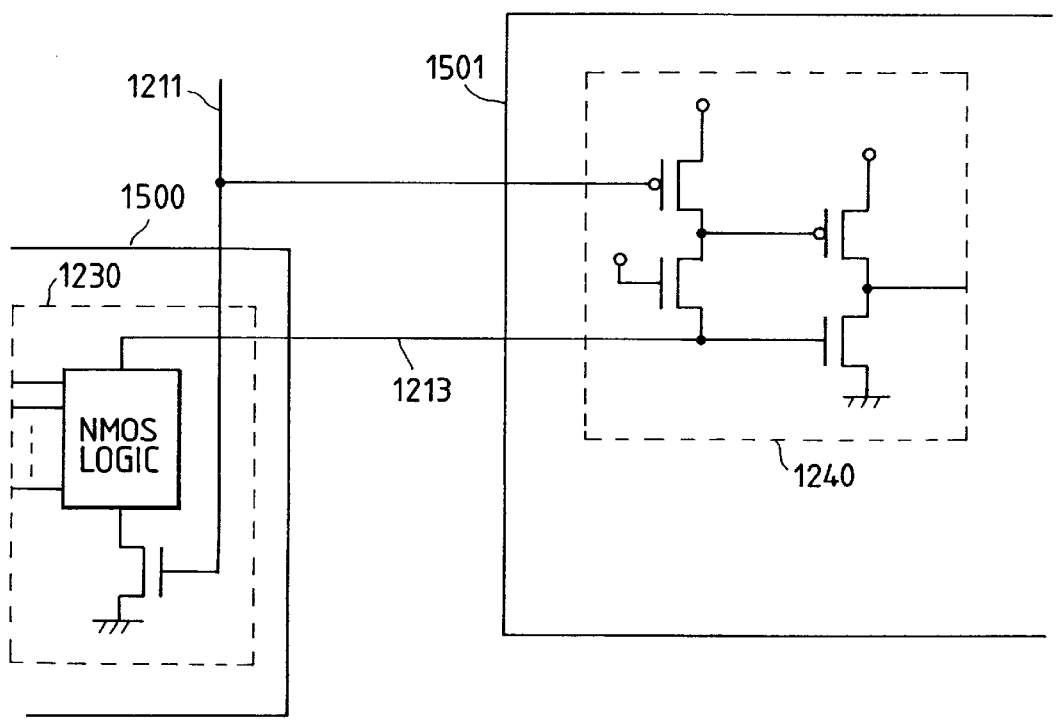
FIG. 15 illustrates an example where the present invention is applied to the interface between circuit blocks.

FIG. 15 represents the fifteenth embodiment of the present invention.

In the diagram, 1500 and 1501 denote the first and second circuit blocks physically separated inside the semiconductor integrated circuit, and 1213 is a low amplitude bus to connect between the circuit blocks 1500 and 1501.

The present embodiment shows signal transmission between different circuit blocks, similar to FIG. 14. The transmission circuit 1230 actuated by clock signal 1211 is used for the signal transmitter circuit and receiver circuit 1240.

According to the present embodiment, the present invention realizes low power consumption and high speed in the signal transmission between circuit blocks.

Figure 16:
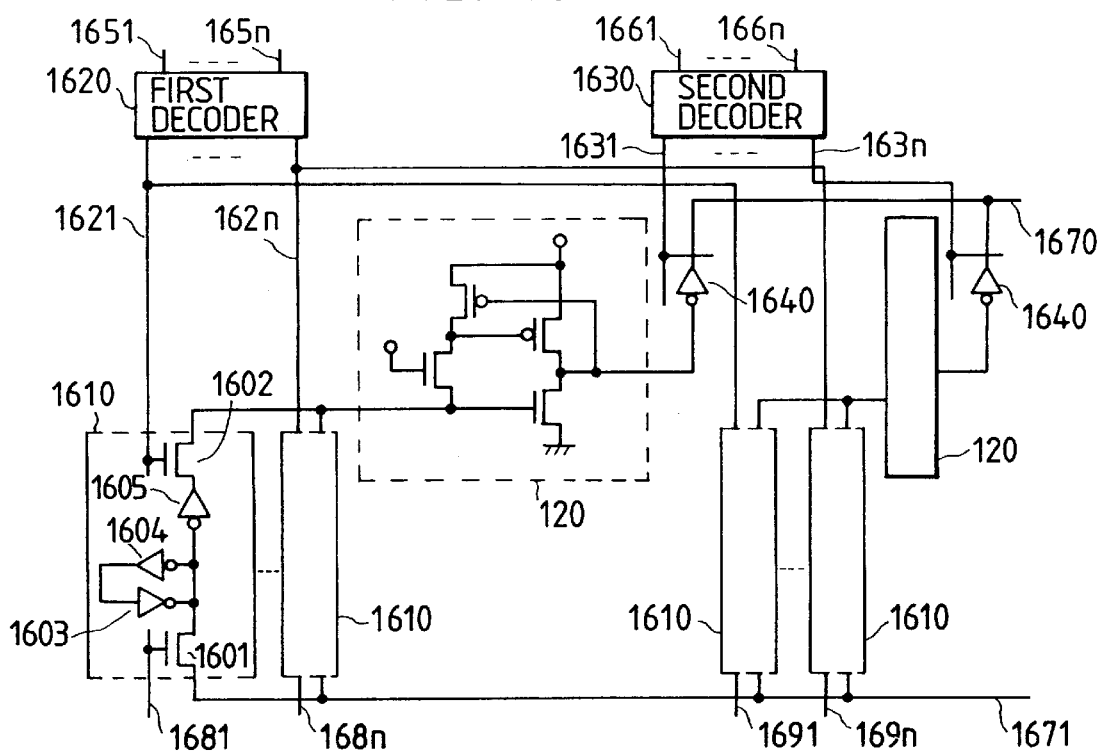
FIG. 16 illustrates an example where the present invention is applied to the register file.

FIG. 16 represents the sixteenth embodiment of the present invention.

The present embodiment shows an example of applying the present invention to the data read-out unit of the register file of the microprocessor or the like.

In the diagram, 1610 denotes a memory cell comprising the data write-in NMOS transistor 1601, data read-out NMOS transistor 1602 and inverter circuits 1603, 1604 and 1605; 1620 and 1630 denote the data read-out first and second decoders, respectively. 1651 to 165n and 1661 to 166n represent address signals. 1621 to 162n and 1631 to 163n signify data read-out decode signal lines, while 1681 to 168n and 1691 to 169n show data write-in decode signal lines. 1640 is a tri-state buffer, 1670 a read-out data line and 1671 a write-in data line.

To read out the memory data in the memory cell 1610, any one of decode signal lines 1621 to 162n is selected at first. Then the memory data in the selected memory cell is read out through data read-out NMOS transistor 1620 inside the memory cell 1610, and is read into the read-out data line 1670 through receiver circuit 120 and tri-state buffer 1640.

In the present embodiment, the data read out through the NMOS transistor 1602 in the memory cell 1610 performs low amplitude operation, so the receiver circuit 120 is provided to receive the read-out data. This ensures register file read-out operation featuring low power consumption and high speed.

In the present embodiment, read-out control of the memory data of memory cell 1610 is provided by the NMOS transistor, thereby reducing the area of memory cell 1610.

Figure 17:
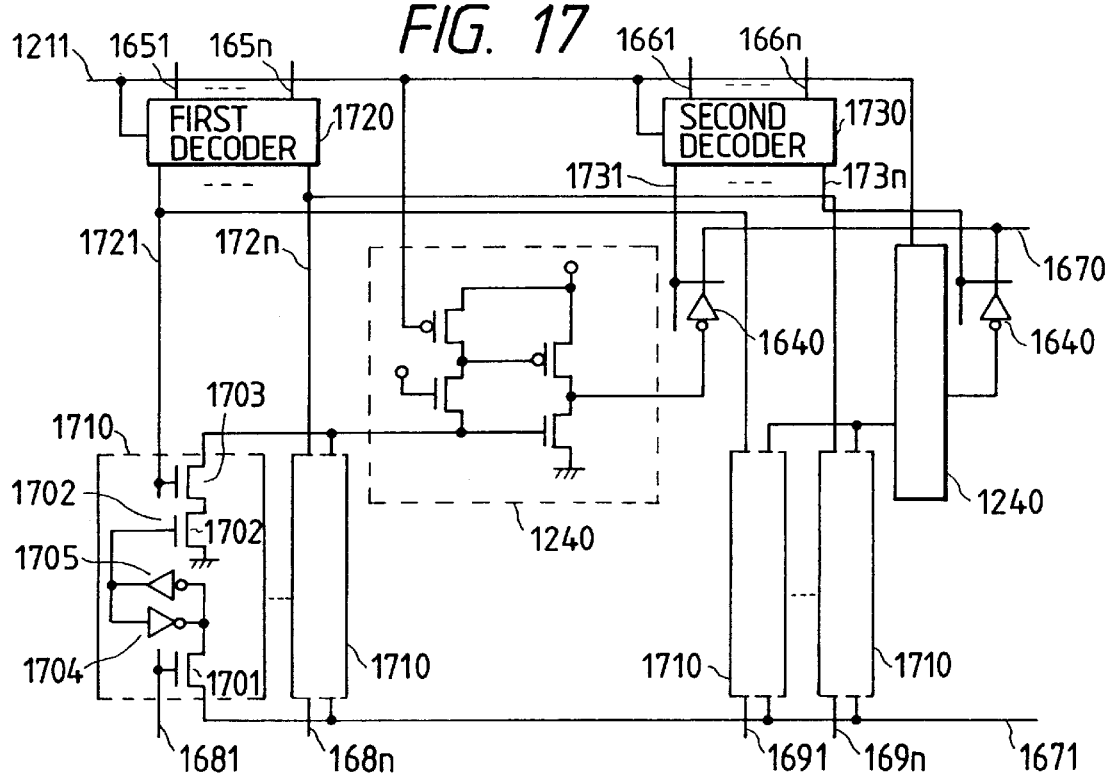
FIG. 17 illustrates an example where the present invention is applied to the register file.
Figure 18:
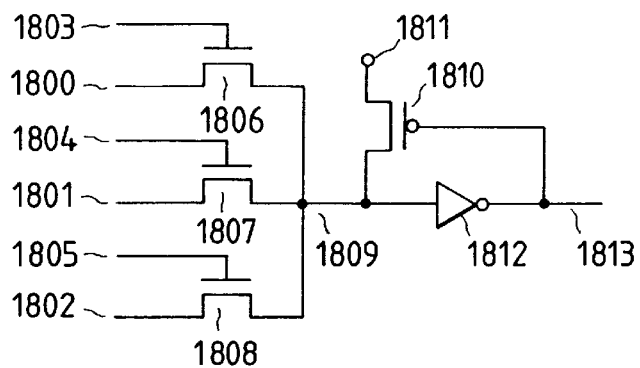
FIG. 18 shows an example of prior art.
Figure 19:
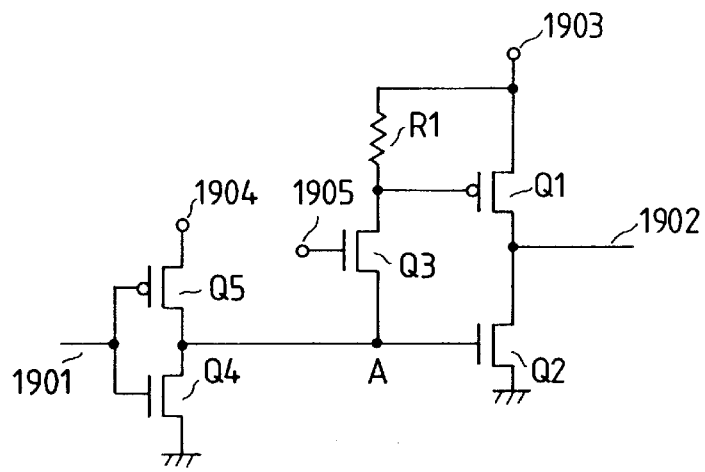
FIG. 19 shows an example of prior art.
Figure 20:
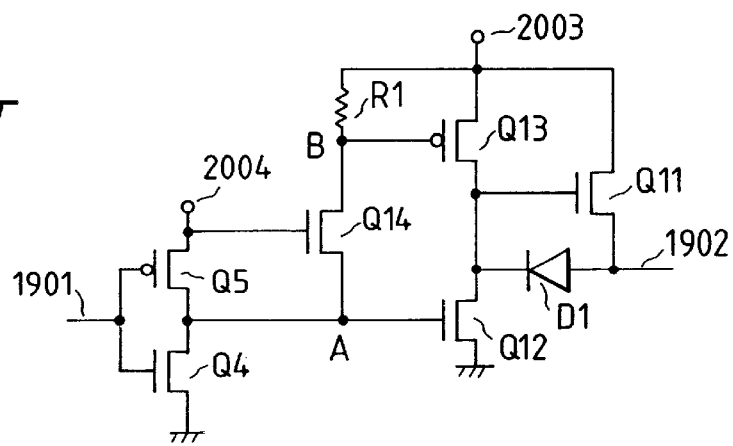
FIG. 20 shows an example of prior art.

FIG. 17 represents the seventeenth embodiment of the present invention.

The present embodiment shows an example of applying the present invention to the data read-out unit of the register file of the microprocessor or the like, as in the case of FIG. 16.

In the diagram, 1710 denotes a memory cell comprising the data write-in NMOS transistor 1701, data read-out NMOS transistors 1702 and 1703 and inverter circuits 1704 and 1705; 1720 and 1730 denote data read-out first and second decoders controlled by the clock signal 1211, respectively. 1721 to 172n and 1731 to 173n signify data read-out decode signal lines.

In the present embodiment, when clock signal 1211 is low, the signal to connect between memory cell 1710 and receiver circuit 1240 is charged to reach the high level. In this case, decode signals 1721 to 172n of the first data decoder 1720 are all low, and all memory cells 1710 are in the non-select state.

When clock signal 1211 goes high, any of decode signals 1721 to 172n goes high, thereby reading out the data from the memory data. These data are read into the read-out data line 1670 through receiver circuit 1240 and tri-state buffer 1640.

According to the present embodiment as well, the read-out data line to read the memory data from memory cell 1610 performs low amplitude operation, thereby ensuring register file read-out operation featuring low power consumption and high speed.

Furthermore, read-out operation is controlled by clock signal 1211, and the signal to connect between the memory cell 1710 and receiver circuit 1240 is made to go low by the NMOS transistor. Read-out operation performed in this way ensures further reduction in the number of elements in memory cell 1710. This has an advantage of reducing the area of the memory cell further than memory cell 1610 discussed in FIG. 16.

Figure 21:
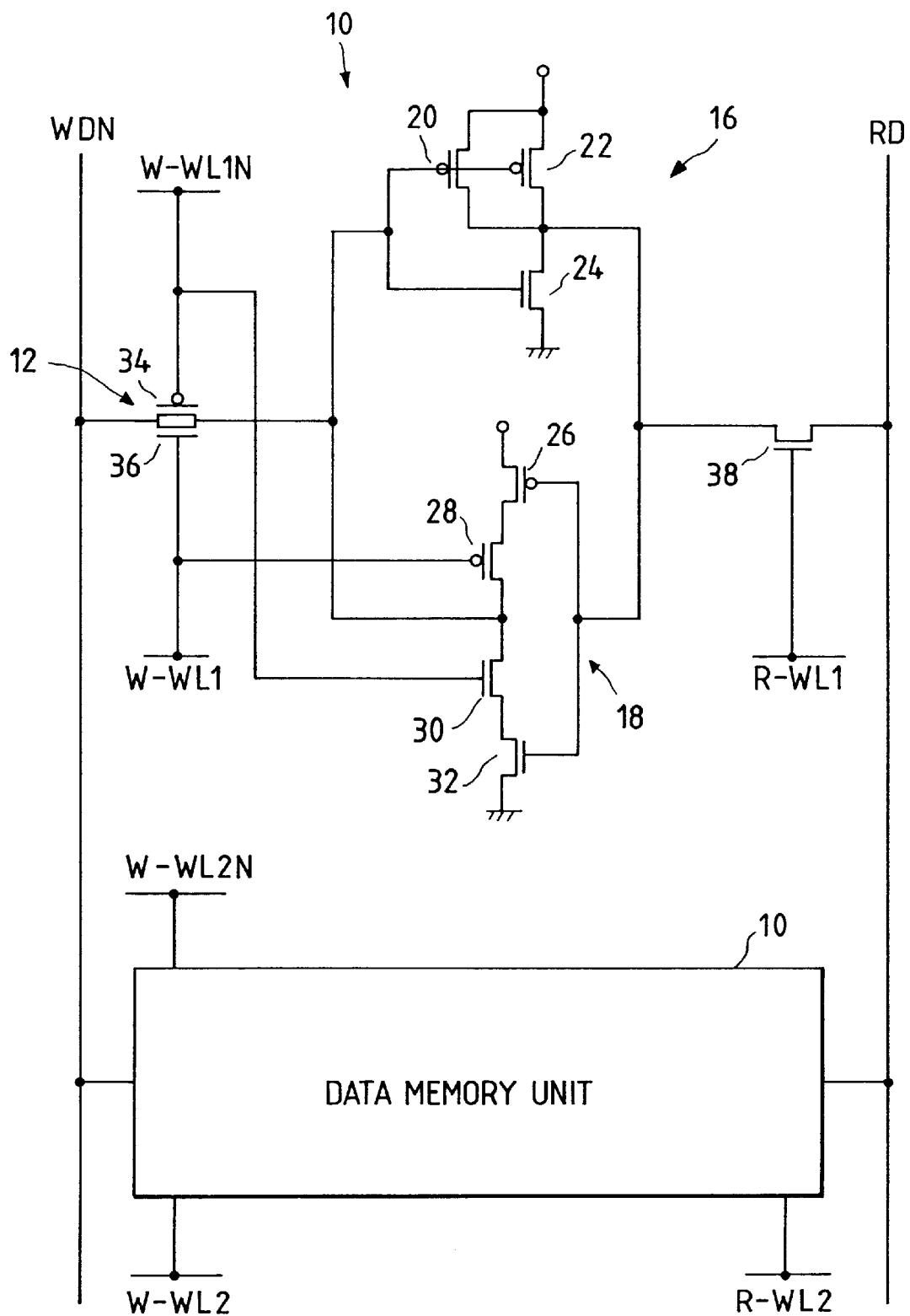
FIG. 21 is an configuration diagram showing the 1W-1R memory cell circuit representing another embodiment of the present invention.

FIG. 21 is a configuration diagram showing the embodiment wherein the two-port memory cell circuit for 1W-1R (one-port write-in, one-port read-out) is configured for two bits. In FIG. 21, the memory cell circuits comprising the MOSFETs are formed on the circuit board adjacent to each other so as to be connected to the same data line. For the brevity of description, the following describes one memory cell circuit alone: The memory cell circuit comprises data memory unit 10, data input unit 12 and data output unit 14. Data input unit 12 is linked to the write data line WDN, and data output unit 14 is connected to the read data line RD. Data memory unit 10 comprises CMOS inverter 16 and clocked inverter 18, and the input side and output side of each inverter are linked with each other. The CMOS inverter 16 comprises two PMOS transistors 20 and 22 and a single NMOS transistor 24, and transistors 20 and 22 are linked with each other. The gates of transistors 20 and 24 are connected to data input unit 12, and the connection point between transistors 22 and 24 is linked to data output unit 14. Clock inverter 18 is provided with two PMOS transistors 26 and 28, and two NMOS transistors 30 and 32, while the gates of transistors 26 and 32 are linked to data output unit 14. Connection point between transistors 28 and 30 is connected to data input unit 12, with the gate of transistor 28 linked to write word line W-WL1, and the gate of transistor 30 linked to write word line W-WL1N. When the transistors 28 and 30 are off, this clocked inverter 18 shuts off the data memory closed loop, resulting in the output impedance going high. When both transistors 28 and 30 are turned on, a data memory closed loop is formed, and an inverter is established by transistors 26 and 32. This clocked inverter 18 configures data memory unit 10 and is designed to ensure that a loop control unit is formed by transistors 28 and 30.

Data input unit 12 comprises the transfer gate which is composed of the PMOS transistor 34 and NMOS transistor 36. The input side is linked to the write data line WDN while the output side is connected to the data memory unit 10. The gate of transistor 34 is linked to the write word line W-WL1N, and the gate of transistor 36 is connected to the word line W-WL1. Transistors 34 and 36 forms a write data transmission channel connecting between write data line WDN and data memory unit 10, and open or close the write data transmission channel according to the level of word lines W-WL1N and W-WL1. For example, when the level of the word line W-WL1N is 1 (one) and that of the word line W-WL1 is 0 (zero), the transistors 34 and 36 are turned off to cut off the write data transmission channel. When the level of the word line W-WL1N is 0 (zero) and that of the word line WWL1 is 1 (one), both transistors 34 and 36 are turned on to form the write data transmission channel.

On the other hand, data output unit 14 is composed of the transfer gate comprising the NMOS transistor 38. The input side is linked to the data memory unit 10, and the output side is connected to the read data line RD, with the gate linked to the word line R-WL1. This transistor 38 forms a read data transmission channel connecting between data memory unit 10 and read data line RD, and opens or closes the read data transmission channel according to the level of word lines R-WL1. For example, when the level of the word line R-WL1 is 0 (zero), transistor 38 is turned off to cut off the read data transmission channel. When the level of the word line R-WL1 is 1 (one), transistor 38 is turned on to form the read data transmission channel.

In the configuration discussed above, if 0 (zero) data is held in the data input side of data memory unit 10 while 1 (one) is retained in the output side, then the level of word line W-WL1N turns 0 and word line W-WL1 turns 1, in writing 1 (one) from the write data line WDN. Both transistors 34 and 36 are turned on, to connect the write data line WDN to the data memory unit 10 through transistors 34 and 36. In this case, signal of 1 (one) is applied to the gate of the transistor 28, while signal of 0 (zero) is applied to the gate of the transistor 30, with the result that both transistors 28 and 38 are turned off. This cuts off the loop line connecting between the inverters 16 and 18. When 1 is input from the write data line WDN, both transistors 20 and 22 are turned off, with transistor 24 being turned on. This results in the output side of the data memory unit 10 being changed from 1 to 0; then transistor 26 is turned on, while transistor 32 is turned off.

When 1 (one) is retained in the input side of data memory unit 10, and 0 (zero) is kept in the output side, the word line W-WL1N goes from 0 to 1, and the word line W-WL1 goes from 1 to 0. Both transistors 34 and 36 are turned off to shut off the write data transmission channel. Then both transistors 28 and 30 are turned on to form the closed loop connecting between inverters 16 and 18. As a result, 1 (one) is retained in the input side of data memory unit 10, and 0 (zero) is kept in the output side. It should be noted that word line R-WL1 is kept 0, and read data transmission channel is cut off when the data is written.

When the data is read from the data memory unit 10, word line R-WL1 goes from 0 to 1, and transistor 38 is turned on so that the data of data memory unit 10 is read into the read data line RD.

When 1 (high level) is kept in the output side of data memory unit 10 with the read data line RD at 0 (low), and transistor 38 is turned on to read out the data, then electric current flows to the read data line RD through transistors 20 and 22 from the power supply Vcc of inverter 16, resulting in reduced output level of inverter 16. When the output level of inverter 16 has reduced below the logic threshold voltage of clocked inverter 18, transistor 26 having been off is turned on, and the output level of clocked inverter 18 is reversed; further, the output of inverter 16 is reversed by the reversed level. This may cause writing errors when reading.

According to the present embodiment, however, transistors 20 and 22 are connected in parallel to each other, thereby reducing the on-resistance. This minimizes voltage drop of transistors 20 and 22, and allows current drive force to be raised. This prevents the output level of inverter 16 from being reduced below the logic threshold voltage of the clocked inverter 18, thereby preventing writing errors from occurring when reading. Furthermore, current drive force can be raised by parallel connection of transistors 20 and 22; this reduces the time required to charge the load capacity of the read data line RD, thereby cutting down the access time.

To read out this 0 data when the level of read data line RD is 1, and 0 is retained in the output side of data memory unit 10, the following operations are performed: When transistor 38 has turned on, electric current flows to the ground terminal from read data line RD through transistor 38 and transistor 24 of the inverter 16, raising the output level of inverter 16. When the output level of inverter 16 has increased above the logical threshold voltage of the clocked inverter 18, transistor 32 having been off is turned on, and the output level of inverter 18 is reversed. At the same time, the output level of inverter 16 is also reversed. This will cause writing errors at the time of reading. According to the present embodiment, however, sufficient voltage is applied between the gate and source of the transistor 24 of the inverter 16. This feature avoids writing errors at the time of reading, without parallel connection of other MOS transistor to the transistor 24.

According to the present embodiment, as discussed above, the single-ended read-out port and a single transistor 38 are used to reduce load capacity applied to the read data line RD. At the time of writing, transistors 28 and 30 are off, and the output of clocked inverter 18 has high impedance, thereby ensuring reliable write-in of the data from the write data line WDN. Furthermore, the output impedance of inverter 16 is smaller than the impedance of inverter 18 at the time of data read-out; this configuration avoids writing errors at the time of data read-out.

Figure 22:
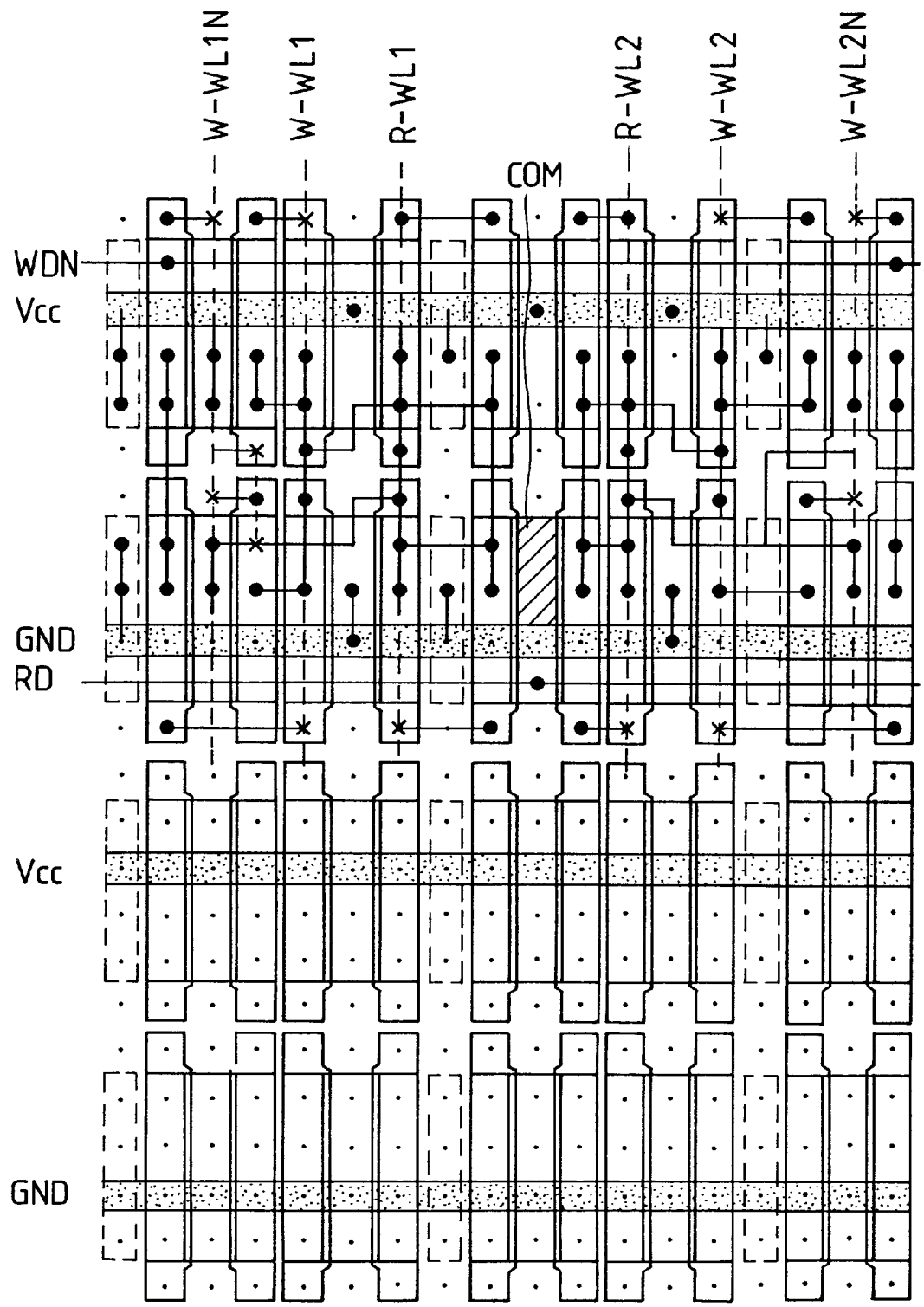
FIG. 22 represents the circuit of FIG. 21 configured using the basic cell of the gate array.

When the circuit in FIG. 21 is to be mounted on the circuit, it is possible to use the configuration shown in FIG. 22. In FIG. 22, black circles denote contact holes between the metal wiring on the first layer shown in solid lines and MOS transistor. "x" represents the through-hole between the metal wiring on the first layer and the metal wiring on the second layer. Of a group of transistors constituting the memory cell circuit, the PMOS transistor is located under the power Vcc, and the NMOS transistor is laid out under the ground line DGN. The write data line WD and read data line RD are laid in the lateral direction by the metal wiring of the first layer, and word lines W-WL1N, W-WL1 and R-WL1 are laid by the metal wiring of the second layer in the longitudinal direction. Furthermore, each transistor 38 constituting the data output unit 14 of the memory cell circuit is laid adjacent to the other, and is formed on the shared area COM of the diffused layer connected to the read data line RD, resulting in further reduction of load capacity added to the read data line RD and in reduction of the access time.

In FIG. 22, the memory configuration pattern is not shown under the basic cell; this pattern can also be formed. When eight transistors are used for the basic cell, the memory circuit in said embodiment is capable of forming a memory cell circuit for one bit with 1.25-basic cell. In the memory circuit in said embodiment, the number of PMOS transistors is the same as that of NMOS transistors; this feature avoids the presence of unwanted MOS transistors in the basic cell.

When the data read from the memory cell circuit shown in FIG. 21 is to be transmitted through read data line RD, it can be considered to connect the CMOS inverter as a buffer to the read data line RD, and to transmit the data through CMOS inverter. When the data is to be read through transistor 38, with the NMOS transistor 38 connected to the read data line RD, however, zero (low level) is the ground potential level and 1 (high level) is Vcc-Vth for amplitude potential of the read data line RD, where Vcc stands for power supply potential level, and Vth represents the threshold voltage of NMOS transistor 38. Accordingly, if the high level signal with reduced voltage is transmitted, the NMOS transistor of the CMOS inverter is turned on by the high level signal, but voltage Vcc-Vth is applied as high level voltage between the gate and source of the PMOS transistor, causing leak current to flow to the PMOS transistor, and making it impossible to ensure low power consumption.

Figure 23:
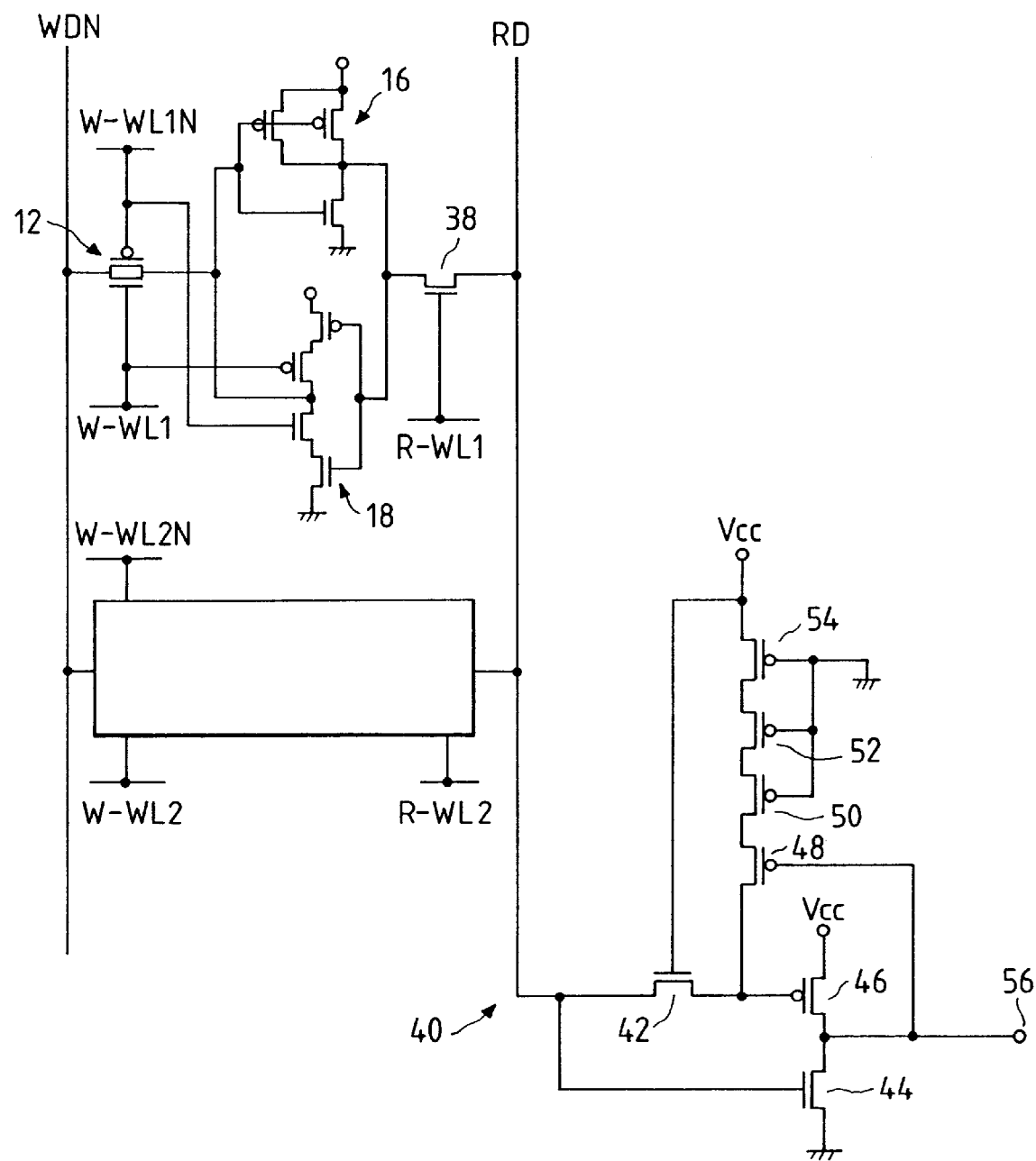
FIG. 23 shows the overall configuration diagram representing the level shift circuit.

To solve this problem, level shift circuit 40 is connected to the read data line RD in the present embodiment, as shown in FIG. 23, thereby ensuring low power consumption.

Level shift circuit 40 is provided with NMOS transistors 42 and 44 and PMOS transistors 46, 48, 50, 52 and 54; the CMOS inverter is formed by transistors 44 and 46, and transistor 42 is connected between the gate of transistor 46 and read data line RD. The serial connection point with transistors 44 and 46 is connected with the output terminal 56, and transistor 48 is provided between this output terminal 56 and the gate of transistor 46. The gate of transistor 48 is connected to output terminal 56, the drain is linked to the gate of the transistor 46, and the source is connected to the power supply Vcc through transistors 50, 52 and 54. Transistors 50, 52 and 54 are connected to one another in series, with each gate being grounded.

The level shift circuit 40 in said configuration turns on transistor 44 when the level of the read data line RD has changed from 0 to 1, causing the level of output terminal 56 to change from 1 to 0. As a result, transistor 48 turns on, and the gate voltage of transistor 46 is pulled up to the power supply potential. It should be noted that transistors 50, 52 and 54 are always kept turned on. So transistor 46 is kept fully off, and it is possible to prevent the leak current from flowing from the power supply Vcc to the ground terminal, even if the transistor 44 is on.

When the level of read data line RD changes from 1 to 0, transistor 44 turns off, and transistor 46 turns on. Then the level of output terminal 56 changes from 0 to 1. In this case, current is restricted by transistors 50 to 54, so the gate potential of transistor 46 can be quickly reduced. As discussed above, it is possible to realize a memory cell circuit featuring low power consumption by connecting the level shift circuit 40 to the read data line RD, even if a single transistor 38 is connected to read data line RD, according to the present embodiment.

As will be discussed later, when the data output unit is composed of a single PMOS transistor, if the level shift circuit 40 uses the configuration such that PMOS transistor shown in FIG. 23 and NMOS transistor are replaced with each other, configuration having the power supply terminal and ground terminal replaced with each other, then it is possible to realize a memory circuit featuring low power consumption comprising the read data line RD connected with a single PMOS transistor.

In the memory cell circuit shown in FIG. 21, it is possible to configure the memory cell circuit where one PMOS transistor of the inverter 16 is reduced without writing error occurring at the time of data read-out, and transistor 36 is removed. In this case, it is possible to configure a 1W-1R memory cell circuit for one bit, using four PMOS transistor and four NMOS transistor.

Figure 24A:
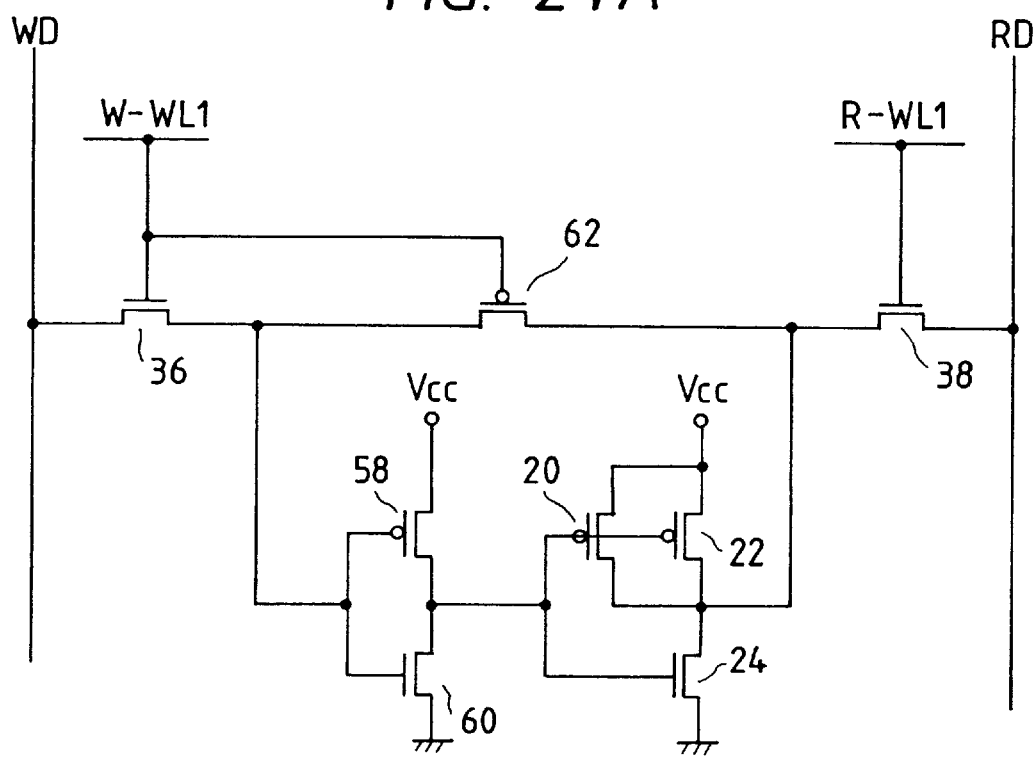
FIGS. 24A and 24B is an configuration diagram showing the 1W-1R memory cell circuit representing still another embodiment of the present invention.
Figure 24B:
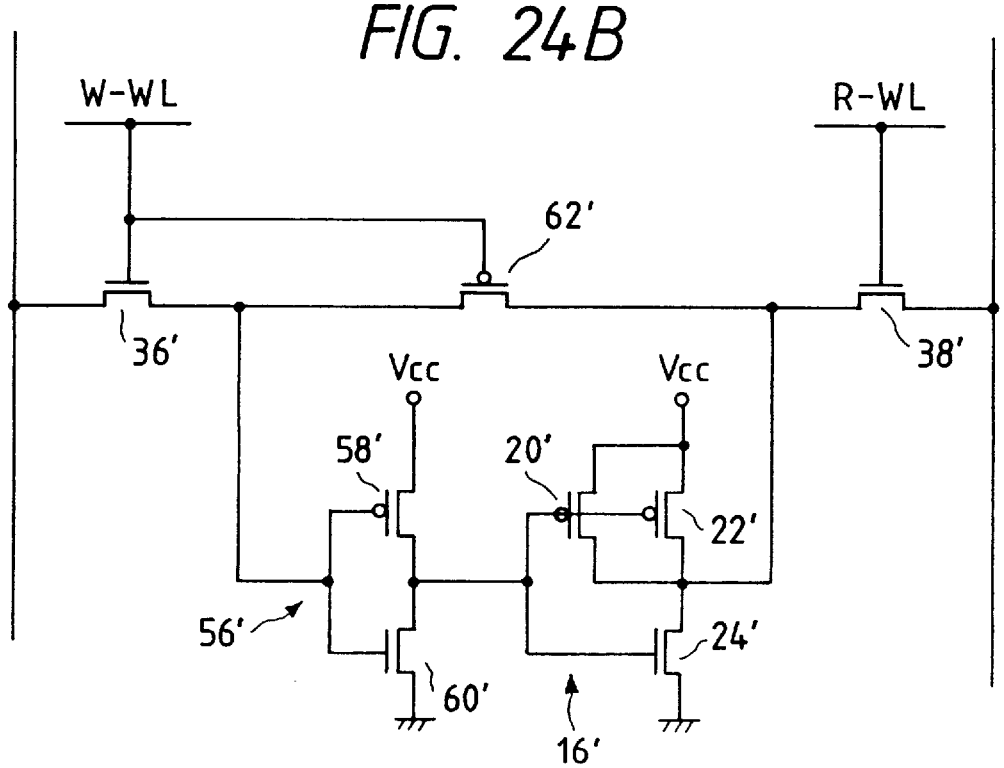

The following describes another embodiment of the two-port memory cell for the 1W-1R (one-port write-in, one-port read-out) with reference to FIG. 24.

The present embodiment shows the case where memory cell circuits for two bits are connected on the same data line in a memory cell where both the read-out and writein ports are single-ended. For the brevity of description, the following describes one memory cell circuit alone.

The memory cell circuit according to the present embodiment is configured so that the data memory unit comprises CMOS inverters 16 and 56, and data input unit is composed of the NMOS transistor 36. The data output unit is made up of the NMOS transistor 38, with the loop controller comprising the PMOS transistor 62. The inverter 56 comprises the PMOS transistor 58 and NMOS transistor 60, and inverter 16 and inverter 56 are connected with each other to configure the data memory closed loop. When writing the data from the write data line WD, word line W-WL1 goes 1 to turns on transistor 36, and to turns off transistor 62; then the data is written. After that, when the level of word line W-WL1 changes from 1 to 0, transistor 6 turns off and transistor 62 turns on to form a loop connecting between the inverters 16 and 56. The written data are held by inverters 16 and 56. When reading the stored data, word line R-WL1 goes 1 to turn on transistor 38; then the data in the data memory unit is read out into the read data line RD.

In said configuration, when the level of the read data line RD is one and the output level of inverter 16 is 1, transistor 38 turns on; then electric current flows to the read data line RD from power supply Vcc through PMOS transistors 20 and 22 and transistor 38 of the inverter 16, thereby reducing the output level of inverter 16. When this level has reduced below the logical threshold voltage of inverter 56, the data stored in the memory cell circuit is reversed to cause write-errors to occur at the time of reading. Similar to the said embodiments, however, PMOS transistors, 20 and 22 of the inverter 16 are connected in parallel to each other to increase current drive force, thereby preventing write-errors from occurring at the time of reading, in the present embodiment. Furthermore, access time can be reduced by parallel connection.

When the level of read data line RD is 1, and that of inverter 16 is 0, transistor 38 is turned on; then electric current flows to the ground terminal from read data line RD through transistor 38 and NMOS transistor 24 of the inverter 16, thereby increasing the output level of inverter 56. If this level has increased over the logical threshold voltage of the inverter 56, the data stored in the memory cell circuit is reversed to cause writeerrors to occur at the time of reading. However, in the present embodiment, sufficient voltage is applied between the gate and source of the NMOS transistor 60 of inverter 56, thereby preventing write-errors from occurring at the time of reading, without having to connect the NMOS transistor in parallel to transistor 60.

According to the present embodiment, the read-out port and write-in port are composed of single NMOS transistors 36 and 38, respectively, to reduce the load capacity to be added to the read data line RD and write data line WD.

Furthermore, transistor 62 is turned off at the time of data writing to shut off the positive feedback loop of the data memory unit and to turn on the transistor 36. This ensures writing of the data on the write data line WD.

In said embodiments, it is possible to configure the memory cell circuit where transistor 62 is replaced by the NMOS transistor and transistor 36 is replaced by the PMOS transistor. In this case, the levels of the voltage to be applied to word line W-WL1 must be the reverse of those in FIG. 24.

Figure 25:
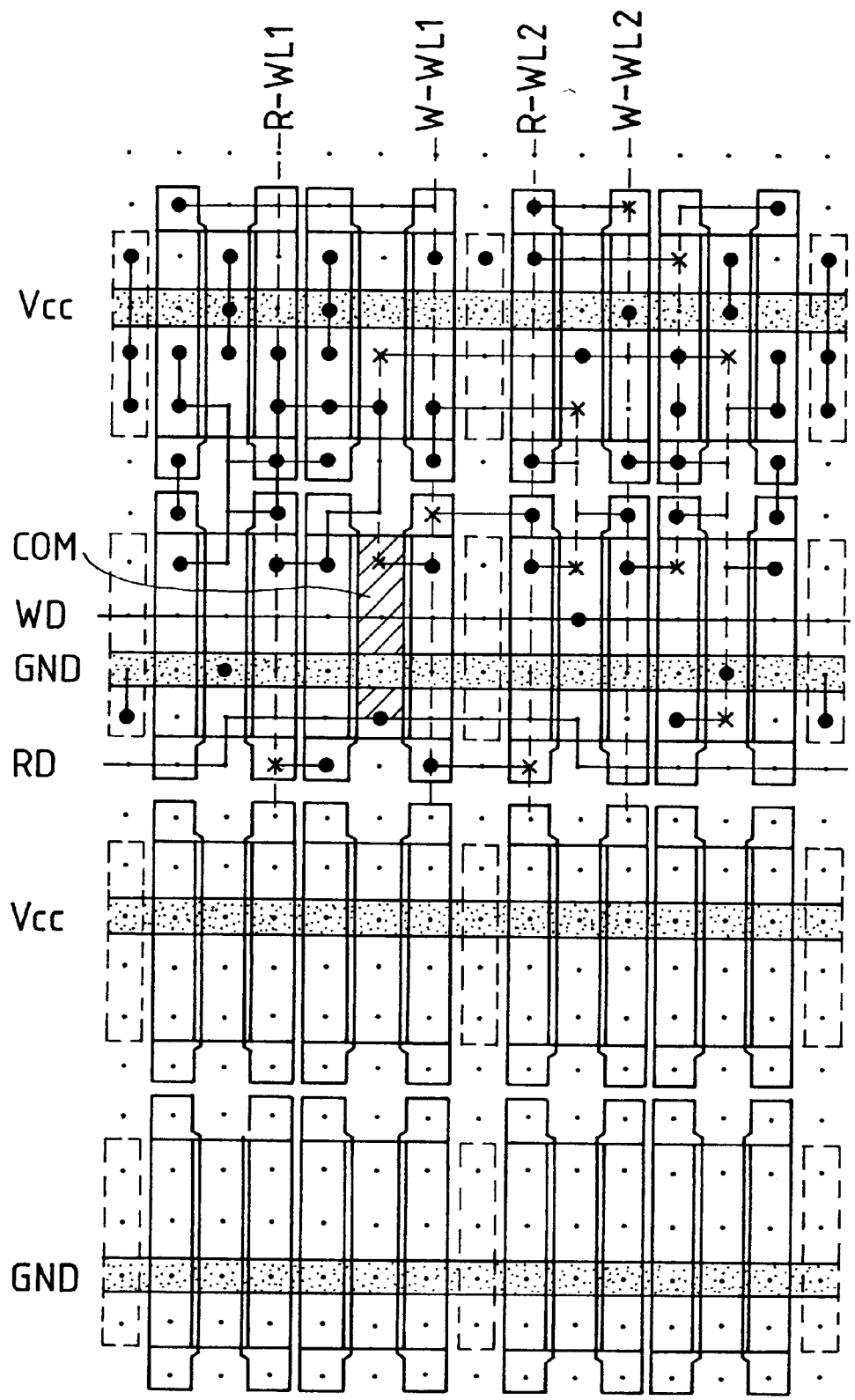
FIG. 25 represents the memory cell circuit of FIG. 24 configured using the basic cell of the gate array.

The configuration shown in FIG. 25 can be used when the memory cell circuit shown in FIG. 24 is to be mounted on the circuit board. In FIG. 25, black circles denote contact holes between the metal wiring on the first layer shown in solid lines and MOS transistor. "x" represents the through-hole between the metal wiring on the first layer and the metal wiring on the second layer. Of a group of transistors, the PMOS transistor is located under the power Vcc, and the NMOS transistor is laid out under the ground line GND. The read data line RD and write data line WD are laid in the lateral direction by the metal wiring of the first layer, and word lines W-WL1 and R-WL1 are laid by the metal wiring of the second layer in the longitudinal direction. Furthermore, transistors 38 and 38' of each memory cell circuit are laid adjacent to each other, and are formed on the shared area COM of the diffused layer connected to the read data line RD. Compared to the case where transistors 38 and 38' are separated, this provides further reduction of load capacity added to the read data line RD, making a contribution to reduction of the access time.

In FIG. 25, the memory configuration pattern is not shown under the basic cell; this pattern can also be formed. The memory circuit in said embodiment is capable of forming a 1W-1R memory cell circuit for one bit with 1-basic cell. In this case, the number of PMOS transistors is the same as that of NMOS transistors; this feature avoids the presence of unwanted MOS transistors in the basic cell. It should be noted that the memory cell circuit in said embodiment can also be used as a memory cell circuit for the 1-R/W (normal single port). In the case of the memory cell circuit, the PMOS transistor is inserted into the positive feedback loop of the data memory unit even if the output side of the inverter 16 is on the ground level. Therefore, the input level of the inverter 56 is increased by the threshold voltage of the transistor 62. Accordingly, leak current may occur to the inverter 56. This must be taken care of when using.

Figure 26:
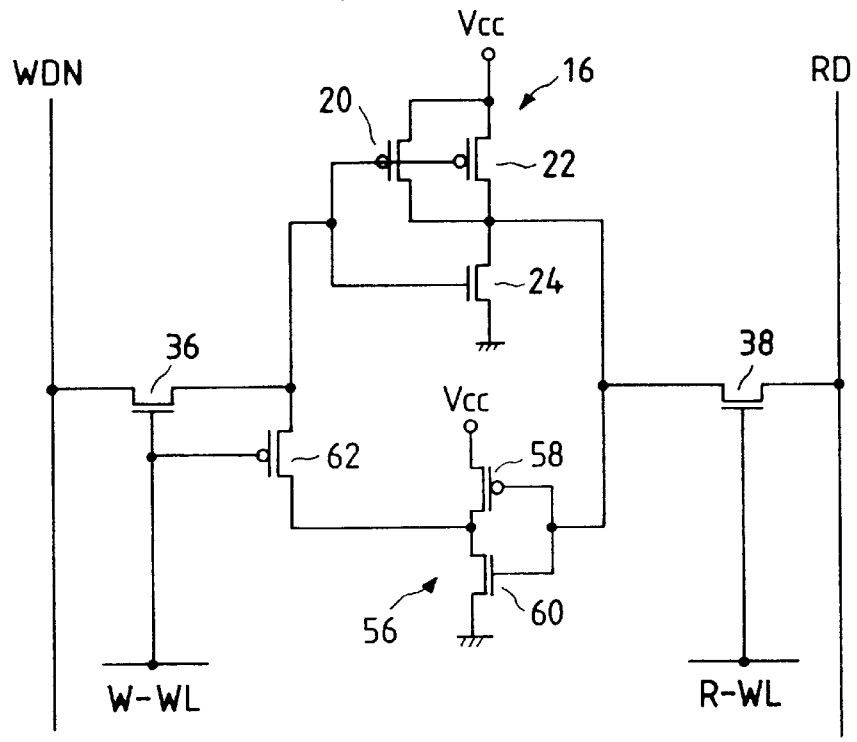
FIG. 26 is an configuration diagram showing the 1W-1R memory cell circuit representing further embodiment of the present invention.

The following describes another embodiment of the two-port memory circuit for the 1W-1R (one-port write-in, one-port read-out) with reference to FIG. 26:

According to the present embodiment, the data memory unit is composed of the CMOS inverters 16 and 56. The data input unit comprises NMOS transistor 36 while the data output unit comprises NMOS transistor 38, with the loop controller composed of PMOS transistor 62. The output side of the inverter 16 and the input side of the inverter 60 are connected to transistor 38, the input side of the inverter 16 is directly connected to transistor 36, and the output side of the inverter 56 is connected to transistor 36 through transistor 62. Otherwise, the configuration is the same as that of said embodiment, so the same symbols are assigned to the same parts; therefore, they are not described below.

In the present embodiment as well, transistor 62 is turned off to cut off the closed loop connecting between the inverter 16 and inverter 56 at the time of data write-in, thereby ensuring data to be written in from the write data line WDN.

Furthermore, transistors 20 and 22 are connected in parallel to prevent writeerrors from occurring at the time of reading.

In the present embodiment, each four of the PMOS transistors and NMOS transistors can be used to configure the two-port memory cell circuit for 1W-1R with one basis cell. The memory cell circuit can also be used as a 1-R/W (normal single port) memory cell circuit.

It is also possible to configure the memory cell circuit where transistor 62 is replaced by the NMOS transistor and transistor 36 is replaced by the PMOS transistor. In this case, the polarity of the word line W-WL1 must be reversed.

Figure 27:
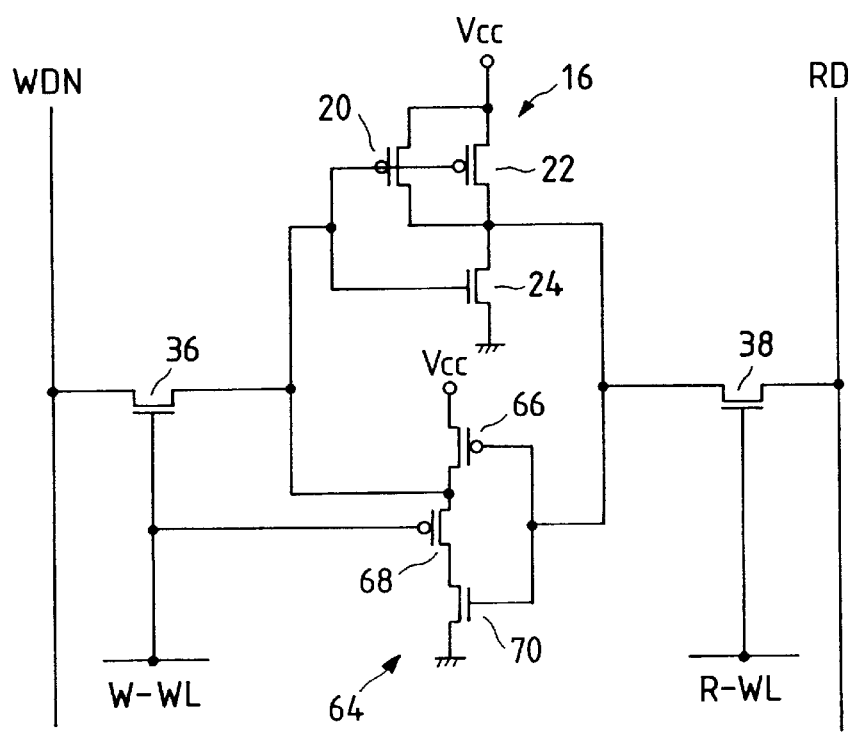
FIG. 27 is an configuration diagram showing the 1W-1R memory cell circuit representing still further embodiment of the present invention.

The following describes another embodiment of the two-port memory cell circuit for 1W/R (one-port write-in, one-port readout) with reference to FIG. 27.

According to the present embodiment, the CMOS inverter 16 and modified CMOS inverter 64 are used to configure the data memory unit. The data input unit comprises configures transistor 36, and the data output unit is composed of transistor 38. The same symbols are assigned to the same parts in said embodiments; therefore, they are not described below. Inverter 64 comprises the PMOS transistors 66 and 68 and NMOS transistor 70, and the connection point between the transistors 66 and 68 is connected to the transistor 36, while the gate of the transistor 68 is connected to the word line W-WL1.

In said configuration, when 1 data is to be written from the write data line WDN, the transistor 36 where the word line W-WL1 is 1 is turned on; while the transistor 68 is turned off to cut off the positive feedback loop connecting between the inverters 16 and 64, thereby ensuring data to be written in from the write data line WDN. On the other hand, when the level of the write data line WDN is 0, electric current flows to the write data line WDN from the power supply Vcc through transistors 66 and 36, causing the output level of the inverter 64 to be reduced sufficiently, thereby ensuring data to be written in from the write data line WDN.

In the present embodiment as well, the read data line RD and write data line WDN are connected to single transistors 36 and 38, respectively, thereby reducing the load capacity added to each data line. Furthermore, the transistors 20 and 22 of the inverter 16 are connected in parallel; this makes it possible to prevent write-errors from occurring at the time of reading by increasing the current drive force, and to reduction of the access time.

In the present embodiment, each four of the PMOS transistors and NMOS transistors can be used to configure the two-port memory cell circuit for 1W-1R with one basis cell. The memory cell circuit can also be used as a 1-R/W (normal single port) memory cell circuit.

In the said embodiment, it is also possible to configure the memory cell circuit where transistor 68 is replaced by the NMOS transistor and transistor 36 is replaced by the PMOS transistor. In this case, the polarity of the word line W-WL1 must be reversed.

In the said embodiment, it is also possible to configure the memory cell circuit where the connection point between the transistors 68 and 70 is connected to the transistor 36, instead of the connection point between the transistors 66 and 68 being connected to the transistor 36.

Figure 28:
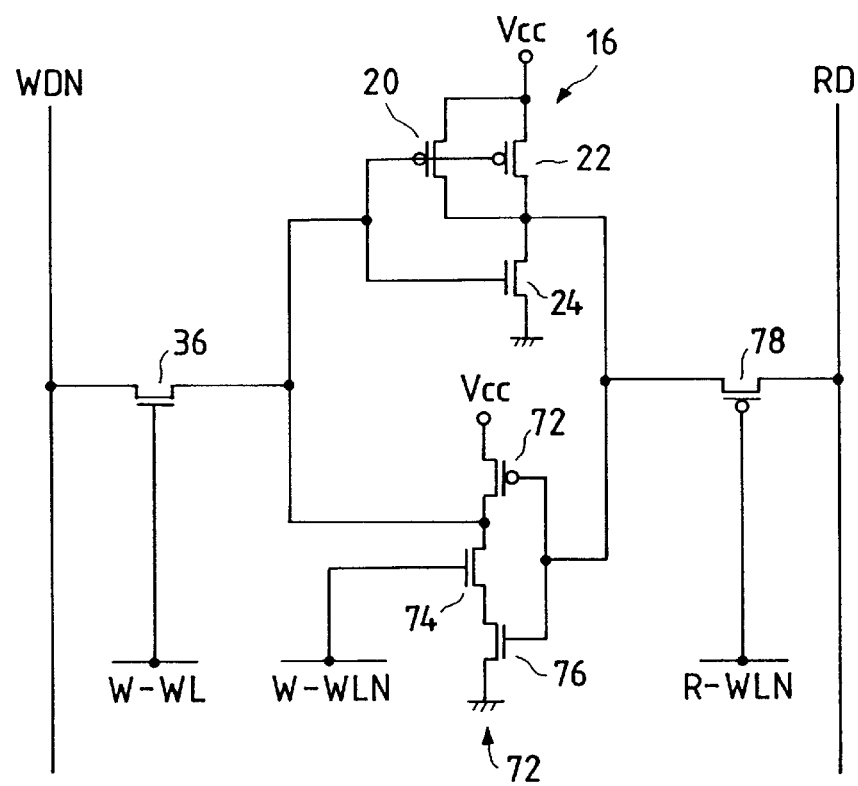
FIG. 28 is an configuration diagram showing the 1W-1R memory cell circuit representing still further embodiment of the present invention.

The following describes another embodiment of the two-port memory cell circuit for 1W/1R with reference to FIG. 28.

According to the present embodiment, the CMOS inverter 16 and modified CMOS inverter 72 are used to configure the data memory unit. The data input unit comprises NMOS transistor 36, while the data output unit is composed of the PMOS transistor 78. The transistor 74 configuring the loop controller comprises the NMOS transistor, and transistor 78 of the data output unit is made up of the PMOS transistor. Otherwise, the configuration is the same as that of FIG. 27, so the same symbols are assigned to the same parts; therefore, they are not described below.

In the present embodiment, the inverter 72 comprises PMOS transistor 72 and NMOS transistors 74 and 76, of which the transistor 74 configuring the loop controller comprises the NMOS transistor, and transistor 78 comprises the PMOS transistor. The gate of transistor 74 is connected to the word line W-WLN, while the gate of transistor 78 is connected to the read-out word line R-WLN. Signals having polarity reverse to that of the word line W-WL1 and word line R-WL1 are applied to word line W-WLN and word line R-WLN.

In the present embodiment, to write in the data when the level of write data line WDN is 1, transistor 74 is turned off to cut off the positive feedback loop connecting between the inverters 76 and 16, and transistor 36 is turned on, thereby ensuring data to be written in from the write data line WDN.

On the other hand, to write in the data when the level of the write data line WDN is 0, electric current flows to the write data line WD from the power supply Vcc through transistors 72 and 36, the output level of the inverter 76 is reduced sufficiently, thereby ensuring data to be written in from the write data line WDN.

In the present embodiment as well, the read data line RD and write data line WDN are connected to single transistors 36 and 78, respectively, thereby reducing the load capacity added to each data line. Furthermore, the transistors 20 and 22 of the inverter 16 are connected in parallel; this makes it possible to prevent write-errors from occurring at the time of reading by increasing the current drive force, and to reduction of the access time.

In the above embodiment, each four of the PMOS transistors and NMOS transistors can be used to configure the two-port memory cell circuit for 1W-1R with one basis cell. The memory cell circuit can also be used as a 1-R/W memory cell circuit.

Figure 29:
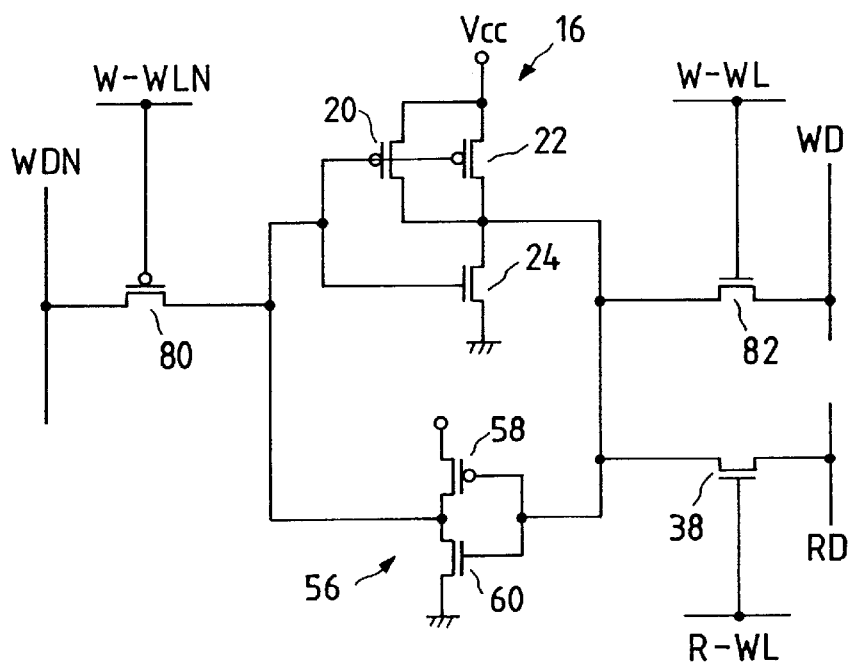
FIG. 29 is an configuration diagram showing the 1W-1R memory cell circuit representing still further embodiment of the present invention.

The following describes another embodiment of the two-port memory cell circuit for 1W-R with reference to FIG. 29.

According to the present embodiment, the CMOS inverters 16 and 56 are used to configure the data memory unit. The two or more data input units comprises PMOS transistor 80 and NMOS transistor 82, while the data output unit is composed of the NMOS transistor 38. The transistor 80 is connected to the write data line WDN, while the transistor 80 is connected to the write data line WD.

In the data memory unit according to the present embodiment, the input and output sides of inverters 16 and 56 are always connected to configure the data memory closed loop. The gates of transistors 80 and 82 are the word line W-WLN and word line W-WL with different polarity. When performing differential write-in, one of transistors 80 and 82 is turned on to write the data from write data line WD or WDN. When reading out the data, transistor 38 is turned on and the stored data is read into the read data line ED.

In the present embodiment as well, transistors configuring the data input unit and the data output unit are single transistors to reduce the load capacity to be added to each data line.

In the present embodiment, the transistors 20 and 22 of the inverter 16 are connected in parallel; this makes it possible to prevent write-errors from occurring at the time of reading by increasing the current drive force, and to reduction of the access time.

In the present embodiment, each four of the PMOS transistors and NMOS transistors can be used to configure the two-port memory cell circuit for 1W-1R with one basis cell. The memory cell circuit can also be used as a 1-R/W memory cell circuit.

According to the present embodiment, it can also be used for the memory cell circuit where transistor 82 and transistor 80 are connected in parallel.

To configure said embodiment, low power consumption can be achieved by connecting the level shift circuit 40 to the read data line. Furthermore, in said embodiment, reference has been made to the case of configuring the metallized memory by using the gate array basic cell. It can also be used as memories other than the gate array, for example, IC and MPU.

In said embodiment, pairs of transistors connected to the read data line are formed on the shared area COM, so it is possible to reduce bonding capacity and to increase memory density.

Figure 30:
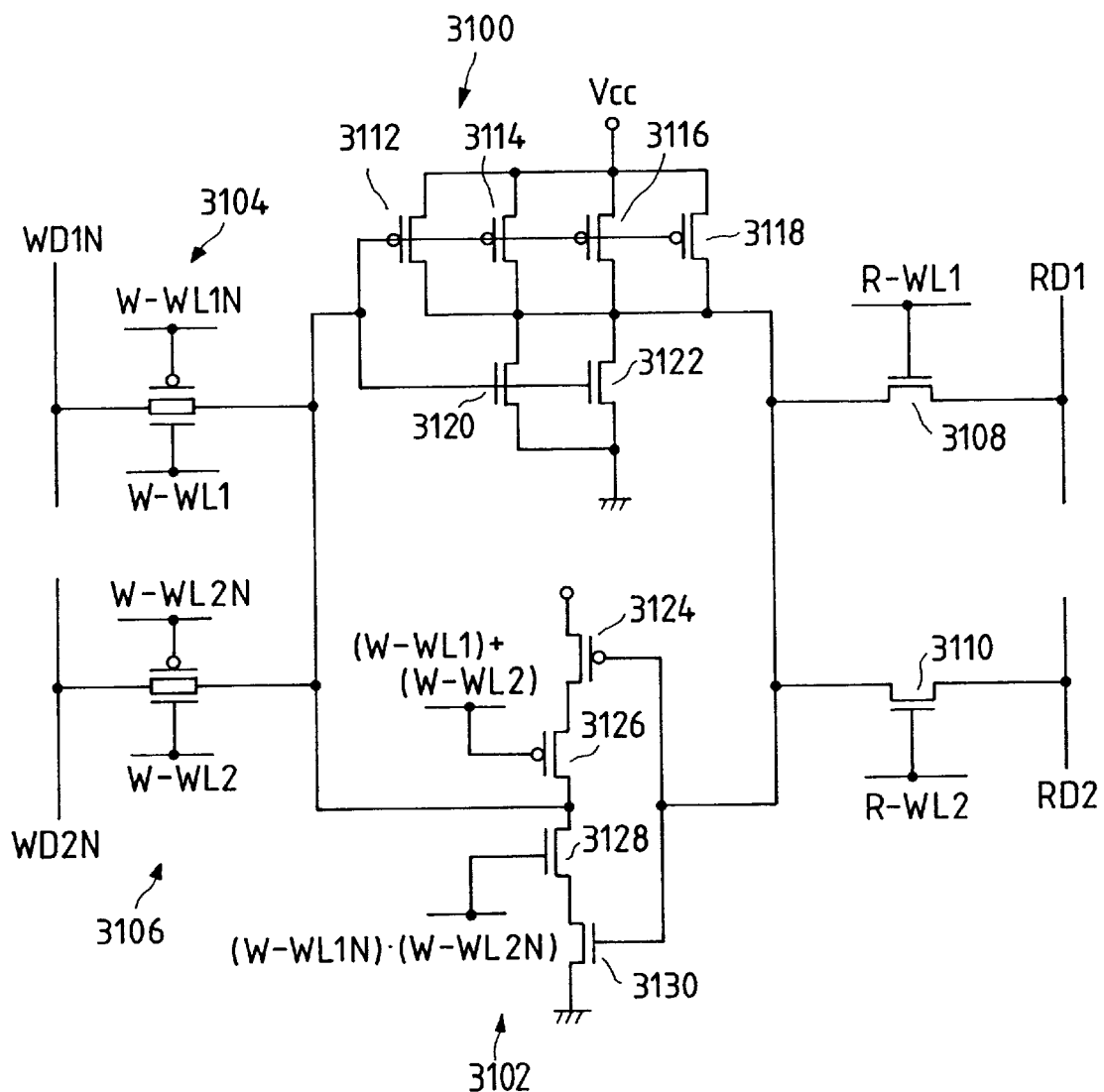
FIG. 30 is an configuration diagram showing the 2W-2R memory cell circuit representing still further embodiment of the present invention.

The following describes another embodiment of the four-port memory cell circuit for 2W-R (two-port write-in, two-port readout) with reference to FIG. 30:

In the present embodiment, the data memory unit comprises the CMOS inverter 3100 and clocked inverter 3102, while the data input unit is composed of transfer gates 3104 and 3106, and the data output unit is made up of NMOS transistors 3108 and 3110 as transfer gates.

The inverter 3100 comprises the PMOS transistors 3112, 3114, 3116 and 3118, and NMOS transistors 3120 and 3122, and the inverter 3102 is composed of the PMOS transistors 3124 and 3126, and NMOS transistors 3128 and 3130. The input and output sides of inverters 3100 and 3102 are connected with each other to form the data memory closed loop. Furthermore, transistors 3112 to 3118 are connected in parallel to each other, while transistors 3120 and 3120 are connected in parallel to each other. The transistors 3126 and 3128 are configured as cable controller, the gate of the transistor 3126 is connected to word line W-WL1 and word line W-WL2 through the OR gate (not illustrated), and the gate of the transistor 3128 is connected to word line W-WL1N and word line W-WL2N through the AND gate (not illustrated).

The transfer gate 3104 comprises PMOS transistor 3132 and NMOS transistor 3134, while the input side is connected to the write data line W1N and The gate of the transistor 3132 is connected to the word line W-WLLN. The transfer gate 3106 is composed of PMOS transistor 3136 and NMOS transistor 3138, and the data input unit is connected to the write data line WD2N, with the gate of transistor 3138 linked to the W-WL2. The output side of the transistor 3108 is connected to the read data line RD1, while the output side of the transistor 3110 is connected to the read data line RD2. The gate of transistor 3108 is linked to the word line R-WL1, and the gate of transistor 3110 is connected to the R-WL2. Transistors 3108, 3110, 3132, 3134, 3136 and 3138 use the work line logic for data input or data output. Namely, when the transistors 3126 and 3128 are off, transfer gate 3104 or 3106 is turned on, allowing the data to be written. After the data has been written, transistors 3126 and 3128 are turned on, and the data is stored in the data memory unit. When the data is stored, the stored data is output to the read data line RD1 or RD2 if the transistor 3108 or 3110 has turned on.

If both transistors 3108 and 3110 are turned on when the level of the read data lines RD1 and DR2 is 0 and the output level of inverter 3100 is 1, then electric current flows to the read data lines RD1 and DR2 from the power voltage Vcc through transistors 3112 to 3118 and transistors 3108 to 3110 of the inverter 3100, resulting in reduced output of inverter 3100. When this level is reduced below the logic threshold voltage of the clocked inverter 3102, the data stored in the memory cell circuit is reversed to cause write-errors to occur at the time of reading.

However, in the present embodiment, four transistors 3112 to 3118 of inverter 3100 are connected in parallel to reduce the current drive force, thereby preventing write-errors from occurring at the time of reading. Furthermore, parallel connection of these transistors shortens the access time.

On the other hand, if both transistor 3108 and 3110 have turned on when the level of read data line RD1 and RD2 is 1 and the output level of inverter 3100 is 0, electric current flows to the ground terminal from the read data lines RD1 and RD2 through transistors 3108 to 3110 and NMOS transistor of the inverter 3100, resulting in increased output of inverter 3100. When this level is increased above the logic threshold voltage of the clocked inverter 3102, the data stored in the memory cell circuit is reversed to cause write-errors to occur at the time of reading. However, in the present embodiment, sufficient voltage is applied between the gate and source of the NMOS transistors 3120 and 3122 of inverter 3100, and the transistors 3120 and 3122 are connected in parallel, thereby preventing write-errors from occurring at the time of reading.

In the present embodiment, transistors 3108 and 3110 are single NMOS transistors to reduce the load capacity to be added to read data lines RD1 and RD2.

In the present embodiment, if transfer gates 3104 and 3106 turn on at the time of writing, transistors 3126 and 3128 are turned off to make the output impedance of the inverter 3102 high, thereby ensuring data to be written in from the write data line WDN.

In the present embodiment, eight PMOS transistors and eight NMOS transistors are capable of forming a 2W-2R memory cell circuit for one bit.

In the present embodiment, furthermore, transistors 3108 and 3110 connected to the read data lines RD1 and RD2 can be laid out adjacent to each other to form the common area for the diffused layer on the data line side, thereby reducing the load capacity to be added to read data lines RD1 and RD2 and to shorten the access time.

In the circuit shown in FIG. 30, it is possible to configure a circuit where two PMOS transistors of the inverter 3100, as well as and NMOS transistors W-WL14 and W-WL18 of the transfer gates 3104 and 3106, are removed, without write-in errors occurring at the time of reading. In this case, it is possible to configure a 2W-2R memory cell circuit for one bit with six PMOS transistors and six NMOS transistors.

In the present embodiment, it is also possible to configure a circuit by further parallel connection of the NMOS transistor to PMOS transistor of the inverter 3100 and further parallel connection of the NMOS transistor to transistors 3120 and 3122.

Figure 31:
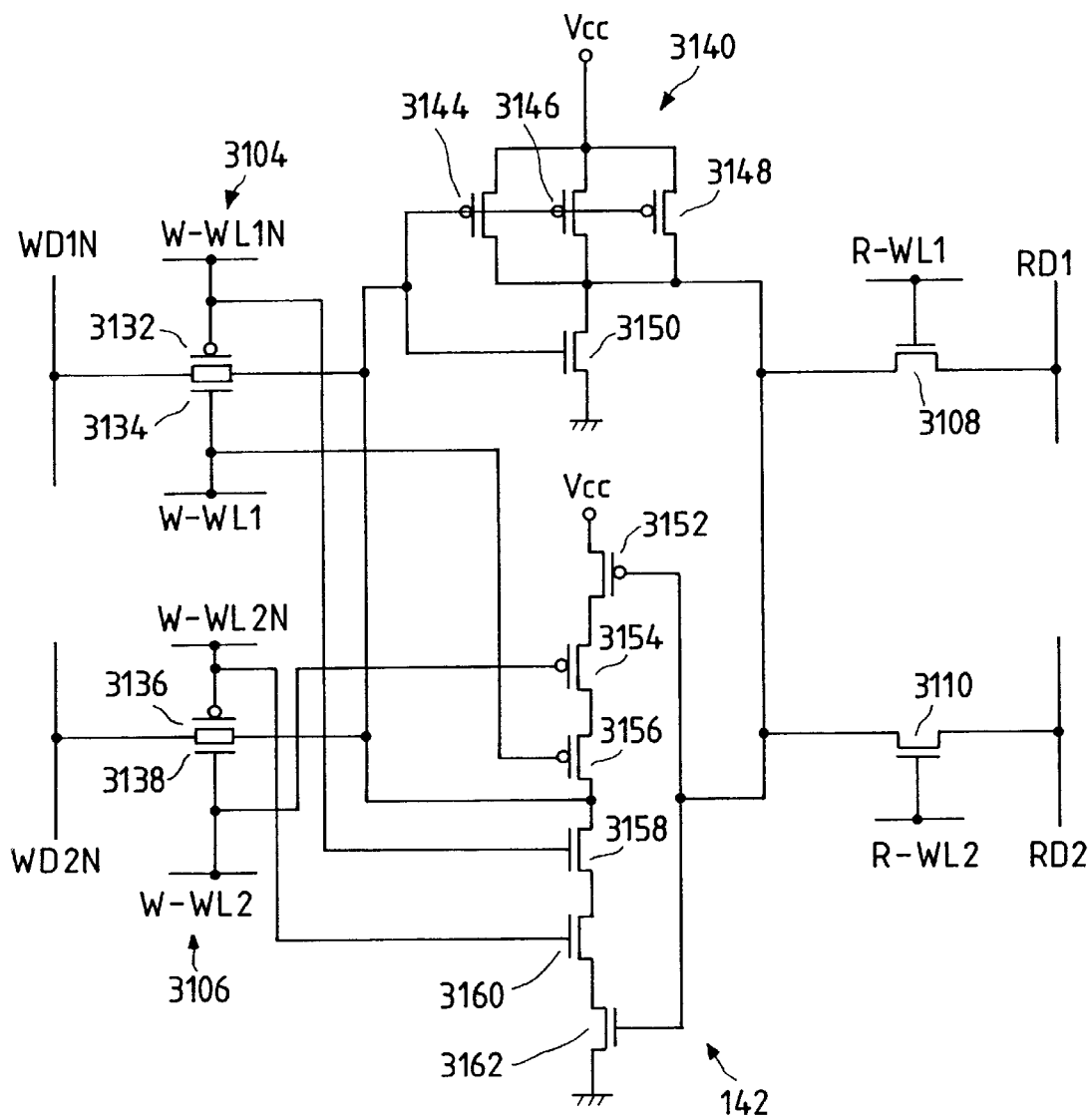
FIG. 31 is an configuration diagram showing the 2W-2R memory cell circuit representing still further embodiment of the present invention.

The following describes another embodiment of the four-port memory cell circuit for 2W-2R with reference to FIG. 31.

According to the present embodiment, the data memory unit comprises the CMOS inverter 3140 and clocked inverter 3142. Instead of controlling the clocked inverter 3102 using the OR and AND gates, the present embodiment intends to provide direct control of the clocked inverter 3142 according to the work line logic. Otherwise, the configuration is the same as that of FIG. 30, so the same symbols are assigned to the same parts as those in FIG. 30; therefore, they are not described below.

CMOS inverter 3140 comprises the PMOS transistors 3144, 3146 and 3148 and NMOS transistor 3150. Three transistors 3144 to 3148 are connected in parallel, and clocked inverter 3142 comprises PMOS transistors 3152, 3154 and 3156 and NMOS transistors 3158, 3160 and 3162, with transistors 3154 to 3160 forming the loop controller. The gate of transistor 3154 is connected to the word line W-WLN2, and the gate of transistor 3156 is connected to the word line W-WL1, while the gate of transistor 3158 is connected to the word line W-WL1N, and the gate of transistor 3160 is connected to the word line W-WL2N. When the data is written in the data memory unit, transfer gates 3104 and 3106 turn on and transistors 3154, 3156, 3158 and 3160 turn off. After the data is written, transfer gates 3104 and 3106 turn off and transistors 3154 to 3160 turn on, thereby forming a closed loop connecting between the inverter 3140 and inverter 3142.

If transistor 3108 and 3110 have turned on when the level of read data line RD1 and RD2 is 0 and the output level of inverter 3140 is 1, electric current flows to the read data lines RD1 and RD2 from the power supply Vcc through PMOS transistor of the inverter 3140 and transistors 3108 to 3110, resulting in reduced output level of inverter 3140. When this level is reduced below the logic threshold voltage of the clocked inverter 3142, the data stored in the memory cell circuit is reversed to cause write-errors to occur at the time of reading. However, in the present embodiment, three transistors 3144, 3146 and 3148 of inverter 3140 are connected in parallel to increase the current drive force, thereby preventing write-errors from occurring at the time of reading.

On the other hand, if both transistor 3108 and 3110 have turned on when the level of read data line RD1 and RD2 is 1 and the output level of inverter 3140 is 0, electric current flows to the ground terminal from the read data lines RD1 and RD2 through transistors 3108 to 3110 and NMOS transistor 3150 of the inverter 3140, resulting in increased output of inverter 3140. When this level is increased above the logic threshold voltage of the clocked inverter 3142, the data stored in the memory cell circuit is reversed to cause write-errors to occur at the time of reading. However, in the present embodiment, sufficient voltage is applied between the gate and source of the transistor 3150 of inverter 3140, thereby preventing write-errors from occurring at the time of reading, by the single transistor as well.

In the present embodiment, transistors connected to the read data lines RD1 and RD2 are single NMOS transistors 3108 and 3110 to reduce the load capacity to be added to read data lines RD1 and RD2.

In the present embodiment, when the data is written, transfer gates 3104 and 3106 turn on and transistors 3154 to 3160 turn off to make the output impedance of the inverter 3142 high, thereby ensuring data to be written in from the write data line WDN.

In the present embodiment, eight PMOS transistors and eight NMOS transistors are capable of forming a 2W-2R memory cell circuit for one bit. In this memory cell circuit, it is possible to reduce the number of write work lines by two, compared to that in memory cell circuit shown in FIG. 30 by two.

In the present embodiment, furthermore, transistors 3108 and 3110 can be laid out adjacent to each other to form the common area for the diffused layer on the data line side, thereby reducing the load capacity to be added to read data lines RD1 and RD2 and to shorten the access time.

In the present embodiment, furthermore, to increase the margin for writing errors at the time of reading, for example, it is also possible to configure a memory cell circuit where the PMOS transistors 3132 of the transfer gate 3104 is removed and this transistor is connected to the PMOS transistor of inverter 3140 in parallel, while transistor 3138 of the transfer gate 3106 is removed and this transistor is connected to transistor,3150 in parallel.

Or it is also possible to configure a cell memory circuit by parallel connection of the transistor of the same polarity to the PMOS transistor and NMOS transistor of inverter 3140, despite the increase in the number of the MOS transistors.

Figure 32:
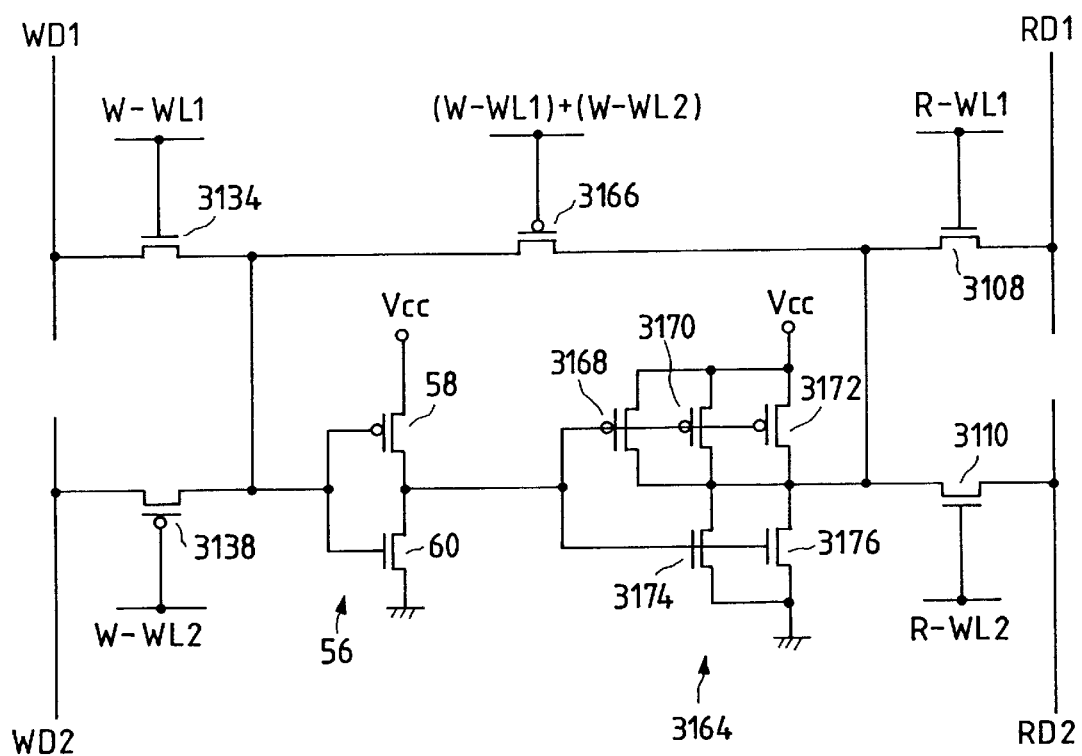
FIG. 32 is an configuration diagram showing the 2W-2R memory cell circuit representing still further embodiment of the present invention.

The following describes another embodiment of the four-port memory cell circuit for 2W-2R with reference to FIG. 32.

According to the present embodiment, the data memory unit comprises the CMOS inverters 56 and 3164 and PMOS transistor 3166, and both the read-in port and write-in port are single ended. Otherwise, the configuration is the same as that of FIG. 31, so the same symbols are assigned to the same parts; therefore, they are not described below.

CMOS inverter 3164 comprises parallel connection of three PMOS transistors 3168, 3170 and 3172, and two NMOS transistors 3174 and 3176. Inverters 56 and 3164 are connected in series, thereby forming a closed loop for data memory unit. PMOS transistor 3166 is incorporated in this closed loop as transfer gate to constitute the loop controller. The gate of this transistor 3166 is connected to the word lines W-WL1 and W-WL2 through the AND gate.

When data is to be written in the data memory unit in the present embodiment, transistors 3134 and 3138 turn on, and transistor 3166 turns off to allow the data to be written while the positive feedback loop is shut off. After the data is written, transistor 3134 and 3138 turn off and transistor 3166 turns on, thereby storing the written data. When transistors 3108 and 3110 have turned on.

The stored data are read out into the read data lines RD1 and RD2.

If transistor 3108 and 3110 have turned on when the level of read data line RD1 and RD2 is 0 and the output level of inverter 3464 is 1, electric current flows to the read data lines RD1 and RD2 from the power supply Vcc through PMOS transistor of the inverter 3164 and transistors 3108 to 3110, resulting in reduced output level of inverter 3164. When this level is reduced below the logic threshold voltage of the inverter 56, the data stored in the memory cell circuit is reversed to cause write-errors to occur at the time of reading. However, in the present embodiment, three transistors 3168, 3170 and 3172 of inverter 3164 are connected in parallel to increase the current drive force, thereby preventing write-errors from occurring at the time of reading.

On the other hand, if both transistor 3108 and 3110 have turned on when the level of read data line RD1 and RD2 is 1 and the output level of inverter 3164 is 0, electric current flows to the ground terminal from the read data lines RD1 and DR2 through transistors 3108 to 3110 and NMOS transistor of the inverter 3164, resulting in increased output of inverter 3164. When this level is increased above the logic threshold voltage of the inverter 56, the data stored in the memory cell circuit is reversed to cause write-errors to occur at the time of reading. However, in the present embodiment, sufficient voltage is applied between the gate and source of the transistors 3174 and 3176 of inverter 3164, thereby preventing write-errors from occurring at the time of reading, by parallel connection of transistors 3174 and 3176.

In the present embodiment, transistors connected to the read data lines are single transistors to decrease the size of the memory circuit and to reduce the load capacity to be added to read data lines RD1 and RD2.

When data is to be written in the data memory unit in the present embodiment, transistors 3134 and 3138 turn on, and transistor 3166 turns off to shut off the positive feedback loop of the data memory unit. This makes the output impedance of the inverter 56 high, thereby ensuring data to be written in from the write data lines WD1 and WD2.

In the present embodiment, it is possible to configure a 2W-2R memory cell circuit for one bit with six PMOS transistors and six NMOS transistors. In the case of this memory cell circuit, it is possible to reduce the numbers of MOS transistors and write-in word lines by four and three, respectively, compared to those in the case of the memory cell circuit shown in FIG. 30.

In the present embodiment, furthermore, transistors 3108 and 3110 connected to the read data lines RD1 and RD2 can be laid out adjacent to each other to form the common area for the diffused layer on the data line side, thereby reducing the load capacity to be added to read data lines RD1 and RD2 and to shorten the access time.

In the embodiment shown in FIGS. 30 to 32, connection of the level shift circuit 40 to the read data lines RD1 and RD2, prevents leak current from flowing, thereby ensuring low power consumption.

In the circuit shown in FIG. 32, sufficient voltage is applied between the gate and source of the NMOS transistor of CMOS inverter; therefore, the NMOS transistor of CMOS inverter, as a single transistor, can prevent write-errors from occurring at the time of reading.

At the time of data writing, transfer gate turns on and clocked inverted output impedance is high to ensure data to be written on the write data lines (WD1N and WD2N).

It can be seen that eight PMOS transistors and eight NMOS transistors can be used to form a 2W-2R memory cell circuit for one bit. In this memory cell circuit, it is possible to reduce the number of write work lines by two compared to that in memory cell circuit shown in FIG. 31.

For the read-out transfer gate, it is possible to share the use of the diffused layer on the data line side of the read-out transfer gate of the adjacent memory cell, thereby reducing the load capacity to be added to each data lines RD1 and RD2 and shortening the access time.

In the circuit of FIG. 32, to increase the margin for writing errors at the time of reading, for example, it is also possible to configure a memory cell circuit where the PMOS transistors of the transfer gate is removed and this transistor is connected to the PMOS transistor of CMOS inverter in parallel, while the NMOS transistor of the transfer gate is removed and this transistor is connected to NMOS transistor of CMOS inverter.

Or in the circuit of FIG. 32, it is also possible to configure a cell memory circuit by increasing the number of the PMOS transistors of CMOS inverter 2120 and NMOS transistors to be connected in parallel, despite the increase in the number of the MOS transistors.

Figure 33:
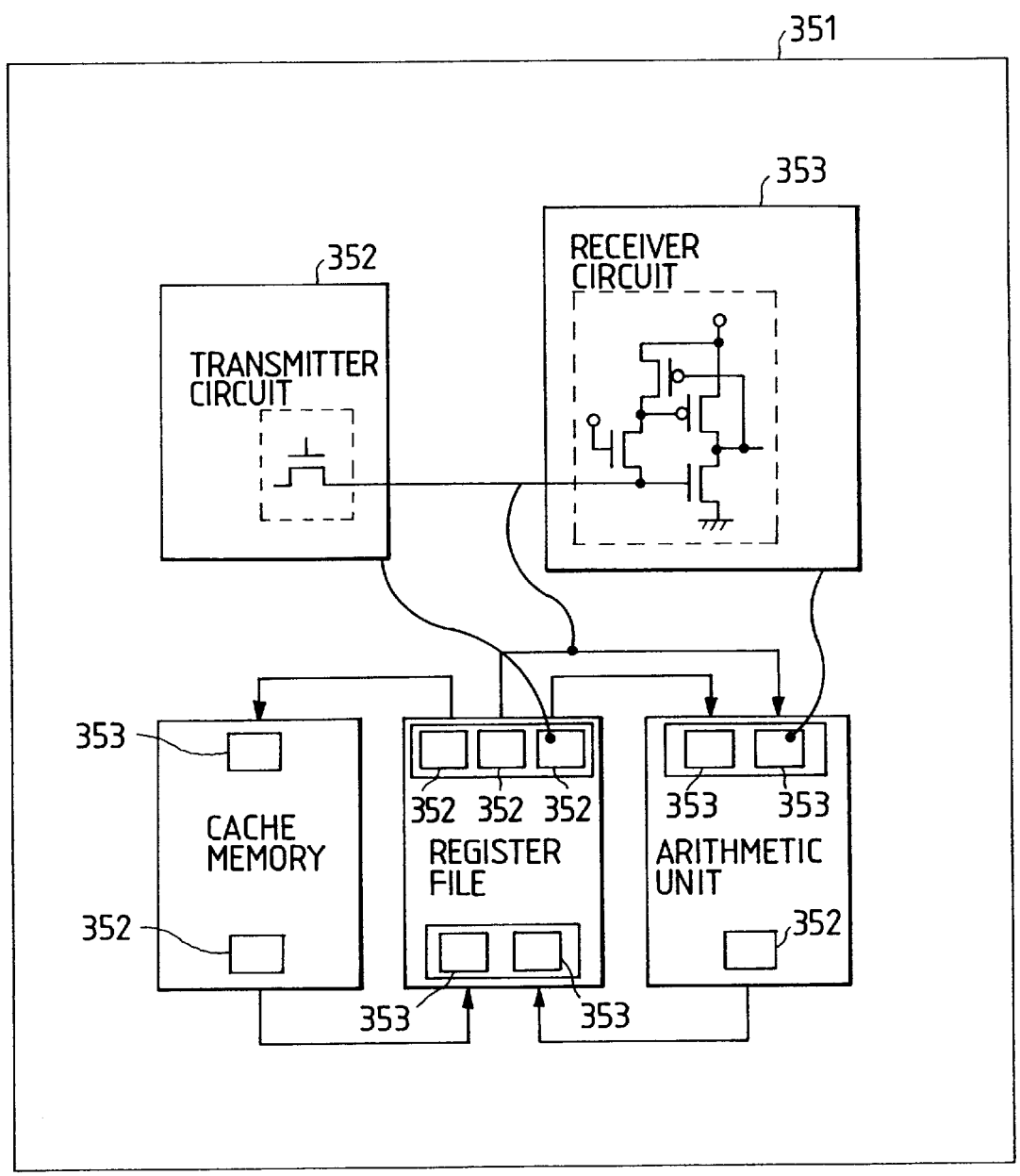
FIG. 33 is an configuration diagram in which the present invention is applied to a microprocessor.

In the circuit of FIG. 33, if the transfer gate has turned on when the level of read-out data lines RD1 and RD2 is low, and the output level of the CMOS inverter is high, electric current flows to the read data lines RD1 and RD2 from the power supply through PMOS transistor of the CMOS inverter and transistor gate, resulting in reduced output level of CMOS inverter. When this level is reduced below the logic threshold voltage of the inverter 2130, the data stored in the memory cell circuit is reversed to cause write-errors to occur at the time of reading. However, in the present embodiment, three PMOS transistors of CMOS inverter are connected in parallel to increase the current drive force, thereby preventing write-errors from occurring at the time of reading.

If the transfer gate has turned on when the level of read-out data lines RD1 and RD2 is high, and the output level of the CMOS inverter is low, electric current flows to the ground terminal from the read data lines RD1 and RD2 through the transfer gate and NMOS transistor of the CMOS inverter, resulting in increased output level of CMOS inverter. When this level is increased above the logic threshold voltage of the inverter, the data stored in the memory cell circuit is reversed to cause writeerrors to occur at the time of reading. However, sufficient voltage is applied between the gate and source of the NMOS transistor of the CMOS inverter, thereby preventing write-errors from occurring at the time of reading, by parallel connection of two NMOS transistors of the CMOS inverter.

When data is to be written, transfer gate turns off to shut off the positive feedback loop of the data memory unit; then the transfer gate turns on, thereby ensuring data to be written in from the write data lines (WD1 and WD2). This shows that it is possible to configure a 2W-2R memory cell circuit for one bit with six PMOS transistors and six NMOS transistors. In the case of this memory cell circuit, it is possible to reduce the numbers of MOS transistors and write-in word lines by four and three, respectively, compared to those in the case of the memory cell circuit shown in FIG. 31.

For the read-out transfer gate, it is possible to share the use of the diffused layer on the data line side of the read-out transfer gate of the adjacent memory cell, thereby reducing the load capacity to be added to each data lines RD1 and RD2 and shortening the access time.

According to the present embodiment as discussed in details so far, the present invention provides a 2W-2R memory circuit featuring high memory density, high speed access and low power consumption.

The embodiments given in FIGS. 30 to 32 have described metallized memory comprising the basic cell of gate array; however, said embodiments are also applicable to memories other than the gate array.

FIG. 35 represents an embodiment where the present invention is applied to the microprocessor.

Microprocessor chip 351 comprises the circuit blocks 352 and 353, cache memory, register file and arithmetic unit.

In the present embodiment, the signal operating at a low amplitude and the transmitter and receiver circuit according to the present invention are applied to the interface between the circuit blocks 352 and 353. It is further provided with a register file where the present invention is applied to the data read-out unit and exchanges data with the arithmetic unit and cache memory.

As described above, the data output unit or data input unit connected to the data line is composed of a single MOS transistor according to the present invention, thereby reducing the load capacity to be added to each data line. Furthermore, it is possible to reduce the number of the transistors configuring the memory cell circuit to increase memory density, and to shorten the access time by reduction in the load capacity. Furthermore, when a level shift circuit is connected to the data line, the present invention prevents leak current from flowing, thereby ensuring low power consumption.

The present invention provides a microprocessor featuring low consumption and high speed operation. Furthermore, it provides an information processing system using said microprocessor again featuring low consumption and high speed operation.

What is claimed is:

1. A semiconductor integrated circuit device comprising a plurality of circuit device units which are driven by a same power source potential, at least a first circuit device unit and a second circuit device unit thereof are mutually coupled, wherein said first circuit device unit comprises a circuit including at least one field effect transistor having a gate, a source and a drain, said circuit generating an output signal at a source or drain of said field effect transistor in accordance with operation thereof, and said output signal having an amplitude range lower than said power source potential, and wherein said second circuit device unit is driven by said power source potential indicative of voltage difference between a first power terminal, applied with a first potential, and a second power terminal, applied with a second, different potential, and comprises:

(a) a first field effect transistor of a first conductivity type having a gate, a source and a drain, said gate thereof is coupled to receive said output signal of said circuit as an input signal to said second circuit device unit, said drain thereof is connected to an output of said second circuit device unit and said source thereof is applied with said second potential;

(b) a second field effect transistor of a second conductivity type, opposite to said first conductivity type, having a gate, a source and a drain, said source thereof is applied with said first potential and said drain thereof is connected to said output of said second circuit device unit;

(c) a third field effect transistor of said second conductivity type having a gate, a source and a drain, said source thereof is applied with said first potential, said drain thereof is connected to said gate of said second field effect transistor and said gate thereof is controlled so that said second field effect transistor attains a non-conducting state when said first field effect transistor is switched to a conducting state; and (d) a fourth field effect transistor of said first conductivity type having a gate, a source and a drain, one of said source or said drain thereof is connected to said gate of said first field effect transistor, and the other of said source or said drain thereof is connected to said gate of said second field effect transistor.

2. A semiconductor integrated circuit device according to claim 1, wherein said gate of said fourth field effect transistor is applied with said first potential, and said gate of said third field effect transistor is connected to said output of said second circuit device unit.

3. A semiconductor integrated circuit device according to claim 2, wherein said first and fourth field effect transistors are N-channel field effect transistors and said second and third field effect transistors are P-channel field effect transistors, respectively, while said first potential is a positive power source potential and said second potential is ground potential.

4. A semiconductor integrated circuit device according to claim 3, wherein said input signal at said gate of said first field effect transistor is a signal having an amplitude which is lower than said first potential by a predetermined threshold value.

5. A semiconductor integrated circuit device according to claim 2, wherein said input signal at said gate of said first field effect transistor is a signal having an amplitude which is lower than said first potential by a predetermined threshold value.

6. A semiconductor integrated circuit device according to claim 1, wherein said input signal at said gate of said first field effect transistor is a signal having an amplitude which is lower than said first potential by a predetermined threshold value.

7. A semiconductor integrated circuit device according to claim 6, wherein said first and fourth field effect transistors are N-channel field effect transistors and said second and third field effect transistors are P-channel field effect transistors, respectively, while said first potential is a positive power source potential and said second potential is ground potential.

8. A semiconductor integrated circuit device according to claim 1, wherein said first and fourth field effect transistors are N-channel field effect transistors and said second and third field effect transistors are P-channel field effect transistors, respectively, while said first potential is a positive power source potential and said second potential is ground potential.

9. A semiconductor integrated circuit device according to claim 1, wherein said gate of said fourth field effect transistor is applied with said first potential and said gate of said third field effect transistor is connected to said output of said second circuit device unit, and wherein said source of said third field effect transistor is applied with said first potential through source-to-drain series connection thereof of a plurality of fifth field effect transistors of said second conductivity type, a gate thereof of each of said fifth effect transistors is applied with said second potential.

10. A semiconductor integrated circuit device according to claim 9, wherein said first and fourth field effect transistors are N-channel field effect transistors and said second, third and fifth field effect transistors are P-channel field effect transistors, respectively, while said first potential is a positive power source potential and said second potential is ground potential.

11. A semiconductor integrated circuit device according to claim 10, wherein said input signal at said gate of said first field effect transistor is a signal having an amplitude which is lower than said first potential by a predetermined threshold value.

12. A semiconductor integrated circuit device according to claim 9, wherein said input signal at said gate of said first field effect transistor is a signal having an amplitude which is lower than said first potential by a predetermined threshold value.

13. A semiconductor integrated circuit device comprising a plurality of circuit device units which are driven by a same power source potential, at least a first circuit device unit and a second circuit device unit thereof are mutually coupled, wherein said first circuit device unit comprises a circuit including at least one field effect transistor having a gate, a source and a drain, said circuit generating an output signal at a source or drain of said field effect transistor in accordance with operation thereof, and said output signal having an amplitude range lower than said power source potential, and wherein said second circuit device unit is driven by said power source potential indicative of voltage difference between a first power terminal, applied with a first potential, and a second power terminal, applied with a second, different potential, and comprises:

(a) a first field effect transistor of a first conductivity type having a gate, a source and a drain, said gate thereof is coupled to receive said output signal of said circuit as an input signal to said second circuit device unit, said drain thereof is connected to an output of said second circuit device unit and said source thereof is applied with said second potential;

(b) a second field effect transistor of a second conductivity type, opposite to said first conductivity type, having a gate, a source and a drain, said source thereof is applied with said first potential and said drain thereof is connected to said output of said second circuit device unit;

(c) a third field effect transistor of said second conductivity type having a gate, a source and a drain, said source thereof is applied with said first potential, said drain thereof is connected to said gate of said second field effect transistor and said gate thereof is applied with a potential level which assures said second field effect transistor reaches a fully non-conducting state when said first field effect transistor is switched to a conducting state; and (d) a fourth field effect transistor of said first conductivity type having a gate, a source and a drain, one of said source or said drain thereof is connected to said gate of said first field effect transistor, and the other of said source or said drain thereof is connected to said gate of said second field effect transistor.

14. A semiconductor integrated circuit device according to claim 13, wherein said gate of said fourth field effect transistor is applied with said first potential, and said gate of said third field effect transistor is connected to said output of said second circuit device unit.

15. A semiconductor integrated circuit device according to claim 14, wherein said first and fourth field effect transistors are N-channel field effect transistors and said second and third field effect transistors are P-channel field effect transistors, respectively while said first potential is a positive power source potential and said second potential is ground potential.

16. A semiconductor integrated circuit device according to claim 15, wherein said input signal at said gate of said first field effect transistor is a signal having an amplitude which is lower than said first potential by a predetermined threshold value.

17. A semiconductor integrated circuit device according to claim 14, wherein said input signal at said gate of said first field effect transistor is a signal having an amplitude which is lower than said first potential by a predetermined threshold value.

18. A semiconductor integrated circuit device according to claim 13, wherein said input signal at said gate of said first field effect transistor is a signal having an amplitude which is lower than said first potential by a predetermined threshold value.

19. A semiconductor integrated circuit device according to claim 18, wherein said first and fourth field effect transistors are N-channel field effect transistors and said second and third field effect transistors are P-channel field effect transistors, respectively, while said first potential is a positive power source potential and said second potential is ground potential.

20. A semiconductor integrated circuit device according to claim 13, wherein said first and fourth field effect transistors are N-channel field effect transistors and said second and third field effect transistors are P-channel field effect transistors, respectively, while said first potential is a positive power source potential and said second potential is ground potential.

21. A semiconductor integrated circuit device according to claim 13, wherein said gate of said fourth field effect transistor is applied with said first potential and said gate of said third field effect transistor is connected to said output of said second circuit device unit, and wherein said source of said third field effect transistor is applied with said first potential through source-to-drain series connection thereof of a plurality of fifth field effect transistors of said second conductivity type, a gate thereof of each of said fifth effect transistors is applied with said second potential.

22. A semiconductor integrated circuit device according to claim 21, wherein said first and fourth field effect transistor are N-channel field effect transistors and said second, third and fifth field effect transistors are P-channel field effect transistors, respectively, while said first potential is a positive power source potential and said second potential is ground potential.

23. A semiconductor integrated circuit device according to claim 22, wherein said input signal at said gate of said first field effect transistor is a signal having an amplitude which is lower than said first potential by a predetermined threshold value.

24. A semiconductor integrated circuit device according to claim 21, wherein said input signal at said gate of said first field effect transistor is a signal having an amplitude which is lower than said first potential by a predetermined threshold value.

* * * * *